United States Patent [19]
Sato et al.

[11] Patent Number: 5,541,866
[45] Date of Patent: Jul. 30, 1996

[54] DEVICE FOR CORRECTING FREQUENCY CHARACTERISTIC OF SOUND FIELD

[75] Inventors: Makoto Sato; Norio Nagashima, both of Hachioji, Japan

[73] Assignee: Kabushiki Kaisha Kenwood, Tokyo, Japan

[21] Appl. No.: 422,764

[22] Filed: Apr. 14, 1995

Related U.S. Application Data

[63] Continuation of Ser. No. 90,125, Oct. 28, 1993, abandoned.

[30] Foreign Application Priority Data

| Nov. 28, 1991 | [JP] | Japan | 3-340037 |
| Oct. 28, 1992 | [JP] | Japan | 4-311150 |
| Nov. 16, 1992 | [JP] | Japan | 4-329002 |

[51] Int. Cl.⁶ .................................................. G11B 5/35
[52] U.S. Cl. .................. 364/724.2; 381/103; 364/572
[58] Field of Search ................................ 381/103, 122, 381/108; 330/304, 306, 291; 364/724.2, 572

[56] References Cited

U.S. PATENT DOCUMENTS

| 4,559,569 | 12/1985 | Otsuki et al. | 360/65 |
| 4,739,513 | 4/1988 | Kunugi et al. | 381/103 |

FOREIGN PATENT DOCUMENTS

| 0198293 | 10/1986 | European Pat. Off. . |
| 0209931 | 1/1987 | European Pat. Off. . |
| 0285316 | 10/1988 | European Pat. Off. . |
| 0398536 | 11/1990 | European Pat. Off. . |
| 58-37217 | 3/1968 | Japan . |
| 59-161907 | 9/1984 | Japan . |
| 60-189128 | 12/1985 | Japan . |
| 61-58049 | 12/1986 | Japan . |
| 2080068 | 1/1982 | United Kingdom . |

*Primary Examiner*—Ellis B. Ramirez
*Assistant Examiner*—Thomas Peeso
*Attorney, Agent, or Firm*—Sixbey, Friedman, Leedom & Ferguson, P.C.; Gerald J. Ferguson, Jr.; Eric J. Robinson

[57] ABSTRACT

A transmission frequency characteristic compensating apparatus capable of obtaining a combination of parameter values allowing a synthetic characteristic not to exceed a predetermined level. The transmission frequency characteristic compensating apparatus has a plurality of filters whose filter coefficients and characteristic are determined in accordance with parameter values corresponding to the center frequency, peak factor, and gain. The apparatus is provided with an input unit 1 for setting parameter values of each filter, an optimum parameter value calculating unit 2 for calculating optimum parameters of a designated filter so as to set the synthetic characteristic of a filter group obtained from the parameter values of the designated filter, within the range of the predetermined level, and a control unit 5 for displaying the frequency characteristic of the designated filter and filter group in accordance with the calculated optimum parameter values.

8 Claims, 32 Drawing Sheets

FIG. 9
| FREQUENCY (Hz) | GAIN [dB] |
|---|---|
| 60 | 8 |
| 120 | 2 |
| 250 | 6 |
| 500 | 4 |
| 750 | 4 |
| 1K | 4 |
| 4K | 7 |
| 8K | 7 |
| 16K | 7 |
FIG. 10
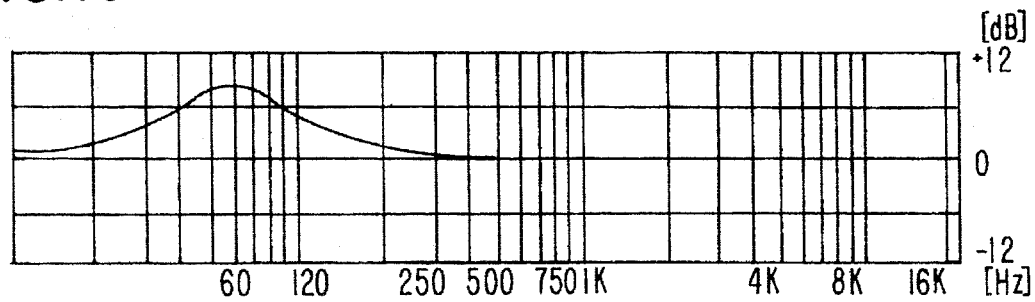
FIG. 11
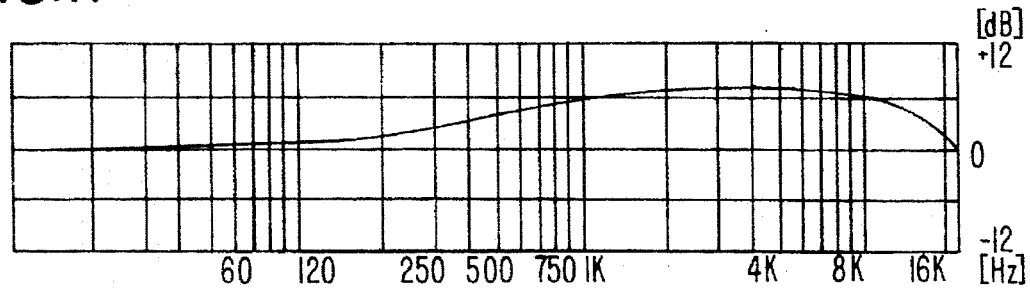

FIG.30
| FREQUENT POINT (Hz) | SENT VALUE (dB) |
|---|---|
| 60 | 8 |
| 120 | 2 |
| 250 | 6 |
| 500 | 4 |
| 1K | 4 |
| 2K | 4 |
| 4K | 8 |
| 8K | 8 |
| 16K | 8 |
FIG.31
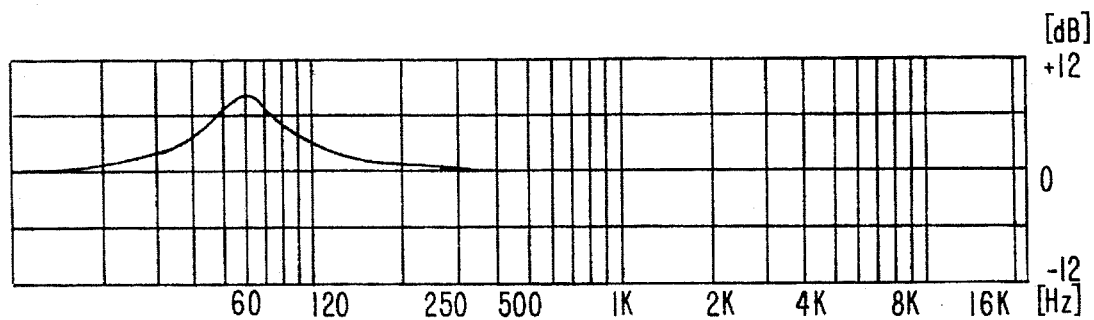
FIG.32
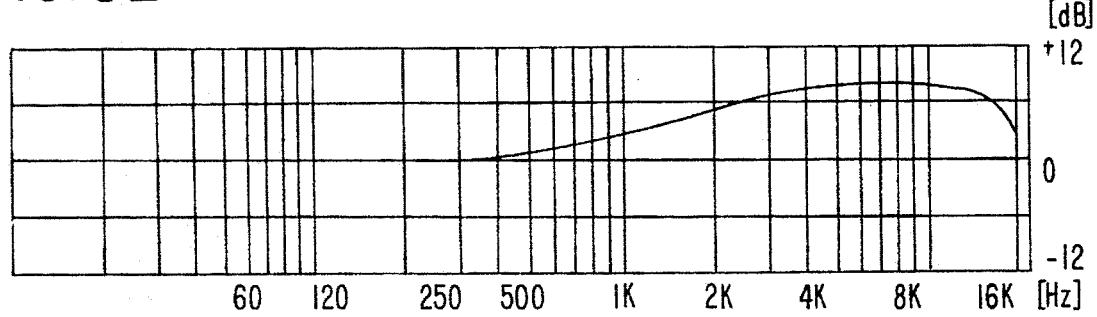

DEVICE FOR CORRECTING FREQUENCY CHARACTERISTIC OF SOUND FIELD

This application is a Continuation of Ser. No. 08/090,125, filed Oct. 28, 1993, now abandoned.

INDUSTRIAL APPLICATION FIELD

The present invention relates to an apparatus for compensating a sound field frequency spectrum, and more particularly to an apparatus for compensating a transmission frequency characteristic capable of obtaining a desired frequency characteristic by a simple manipulation by a user.

PRIOR ART

Recently, audio apparatuses with a built-in transmission frequency characteristic compensation apparatus or graphic equalizer have increased in number, the compensation apparatus adding a desired frequency characteristic compensation to a reproduced sound (original sound) of a CD apparatus or stereophonic apparatus to provide a sound quality preferred by a user. In setting the frequency characteristic by such a graphic equalizer, the gain of a filter of each band is changed using slide/volume as illustratively shown in FIG. 15. A conventional graphic equalizer has a fixed center frequency point (e.g., 60 Hz, 120 kHz, . . . , 16 kHz) and peak factor (e.g., Q=1.77) for each band, leaving only the gain adjustment to a user. There arise therefore a problem of a need of a number of filters as many as the number of setting frequency points and a problem of a difficulty of obtaining a desired flat frequency characteristic. To solve these problems, a system has been developed in which the values of resistors in each filter are changed by a user to adjust the peak factor (Q) and center frequency (fo), as disclosed, for example, in Japanese Utility Model Laid-open Publication No-03-97217.

However, it is not so easy for a user to set a desired frequency characteristic by properly adjusting these three parameters including the center frequency, peak factor, and gain, because these parameters interfere with each other. The proper adjustment of the three parameters requires a considerable skill.

SUMMARY OF THE INVENTION

It is an object of the present invention to provide a compensation apparatus capable of obtaining a desired sound field frequency spectrum with a simple manipulation by a user.

According to the present invention, there is provided setting means for allowing a user to set the gain at each setting frequency point. The setting means is similar to that of a conventional equalizer. According to the present invention, the gain of each setting frequency point is processed by a predetermined algorithm to estimate the center frequencies, gains, and peak factors of several filters suitable for determining a desired frequency characteristic, to determine the filter coefficient parameters, and to store them in a coefficient table. In the frequency characteristic compensation apparatus, each filter is automatically set in accordance with, for example, weight coefficients stored in the coefficient table. The center frequencies, gains, and peak factors of several filters are not fixed but properly determined by using the algorithm of the present invention.

In the process of setting a filter, the gain value for each setting frequency determined by a user is used as input data. The gain value is checked to determine the center frequency, gain, and peak factor of a first filter for the coarse approximation. The difference between the frequency characteristic of the first filter and the desired frequency characteristic is evaluated, for example, at a low band, middle band, and high band. Basing upon the maximum difference at these bands, the second filter is set. In this manner, several filters are set, and if a difference between the synthesized frequency characteristic of these filters and the desired frequency characteristic is within a desired allowance range over the full band, the filter setting is then completed.

A procedure of setting an optimum and small number of filters at high speed is important. In practicing the present invention, a provisional bandwidth is determined basing upon the desired frequency characteristic to decide the peak factor of a filer, and then fuzzy estimation is performed. The center frequency of the filter is first temporarily determined, and then the properness of this center frequency is evaluated while shifting it sequentially.

The structure of the present invention includes variable filter means including a plurality of filters capable of variably setting the filter coefficient parameters defining the center frequency, peak factor, and gain or attenuation, means for setting the gain at each setting frequency point, processor means for determining the center frequency, peak factor, and gain or attenuation of each filter to be set in accordance with the gain at each setting frequency point, memory means for storing coefficient parameters determined by the processor means, and means for supplying the coefficient parameters in the memory means to the variable filter means.

An example of a filter suitable for the present invention is an improved Bell type band-pass filter.

BRIEF DESCRIPTION OF THE DRAWINGS

FIG. 9 shows examples of set data according to the first embodiment.

FIGS. 10 and 11 show the frequency characteristics of the first and second set filters according to the first embodiment.

FIG. 30 shows set data of the second embodiment.

FIGS. 31 and 32 show the frequency characteristics of the first and second filters set in the second embodiment.

DESCRIPTION OF THE EMBODIMENTS

FIRST EMBODIMENT

Figure 1:
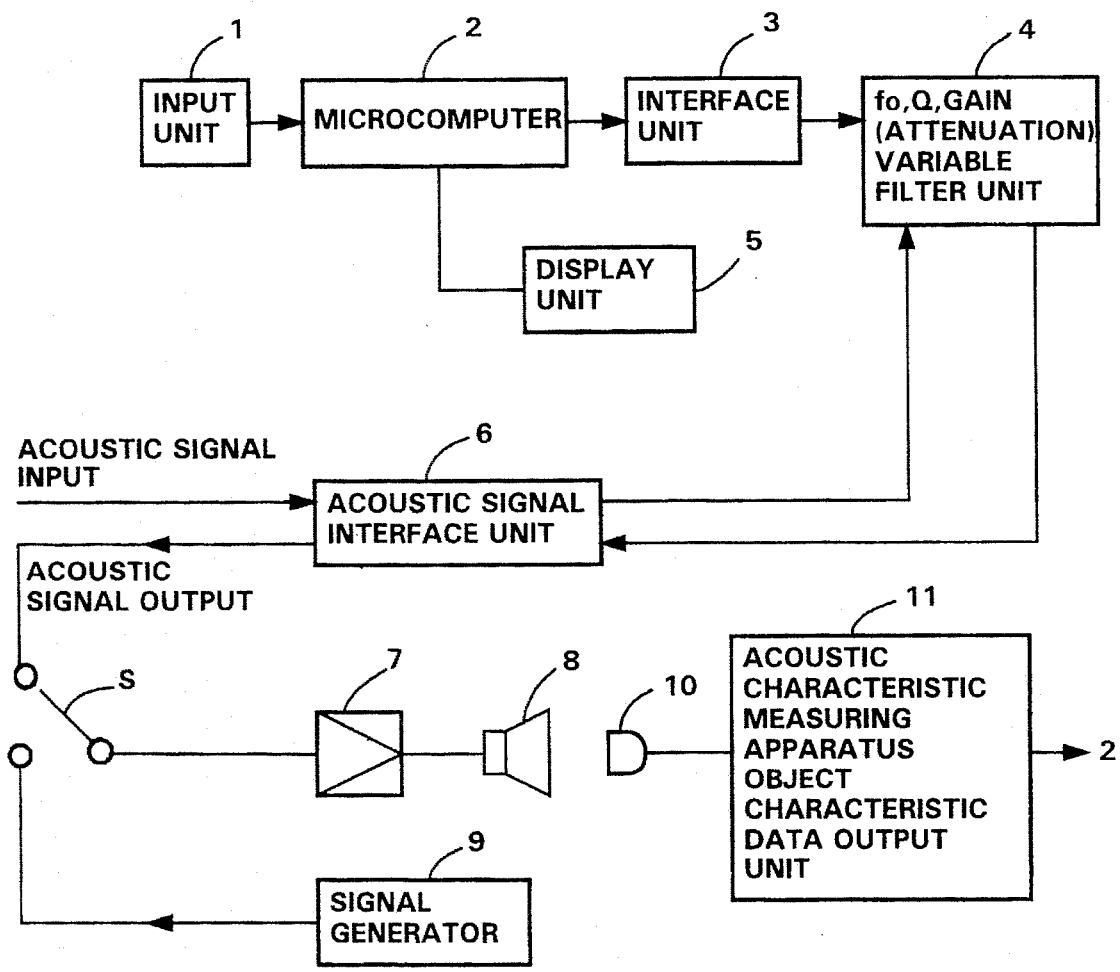
FIG. 1 shows the structure of a first embodiment of the present invention.

FIG. 1 is a block diagram showing the structure of a compensation apparatus or equalizer according to an embodiment of the present invention. An input unit 1 is made of, for example, a slide volume board, key board, light pen, or the like. A user sets a desired frequency characteristic by entering data of gains at specific frequency points such as shown in FIG. 9. A micro computer 2 receives the entered data, calculates therefrom parameters including center frequencies, peak factors, and gain data, respectively for setting a proper variable filter unit, in accordance with a particular algorithm of the present invention, and determines filter weight coefficients. The coefficients are stored in a coefficient table in a main memory of the microcomputer. Calculated correction characteristic is displayed on a display unit 5, and sent to the variable filter unit 5 via an interface unit 3. The variable filter unit 4 has a plurality of filters (maximum number of filters capable of being set=n) each being arbitrarily set with a center frequency (fo), filter peak factor (Q), and gain or attenuation (G). The characteristic of each filter is determined by the coefficient parameters sent from the coefficient table via the interface unit 3. An acoustic signal interface unit 6 sends a reproduced signal (acoustic signal) from a CD or the like to the variable filter unit 4, and sends an acoustic signal subjected to a desired correction process at the variable filter unit 4 to an output amplifier or the like.

A sweep frequency signal or predetermined spectrum distribution signal may be supplied from a signal generator 9 to an amplifier 7 to drive a loudspeaker 8 and radiate sounds into a sound field. Sound signals picked up by a microphone 10 are analyzed by an acoustic characteristic measuring apparatus/object characteristic data outputting apparatus 11 to obtain the sound field frequency spectrum. The obtained frequency spectrum may be supplied to the microcomputer instead of receiving an output from the input unit 1, as the data for compensating a sound field frequency spectrum. In this case, the sound field frequency spectrum can be compensated automatically.

Process Sequence

Figure 2:
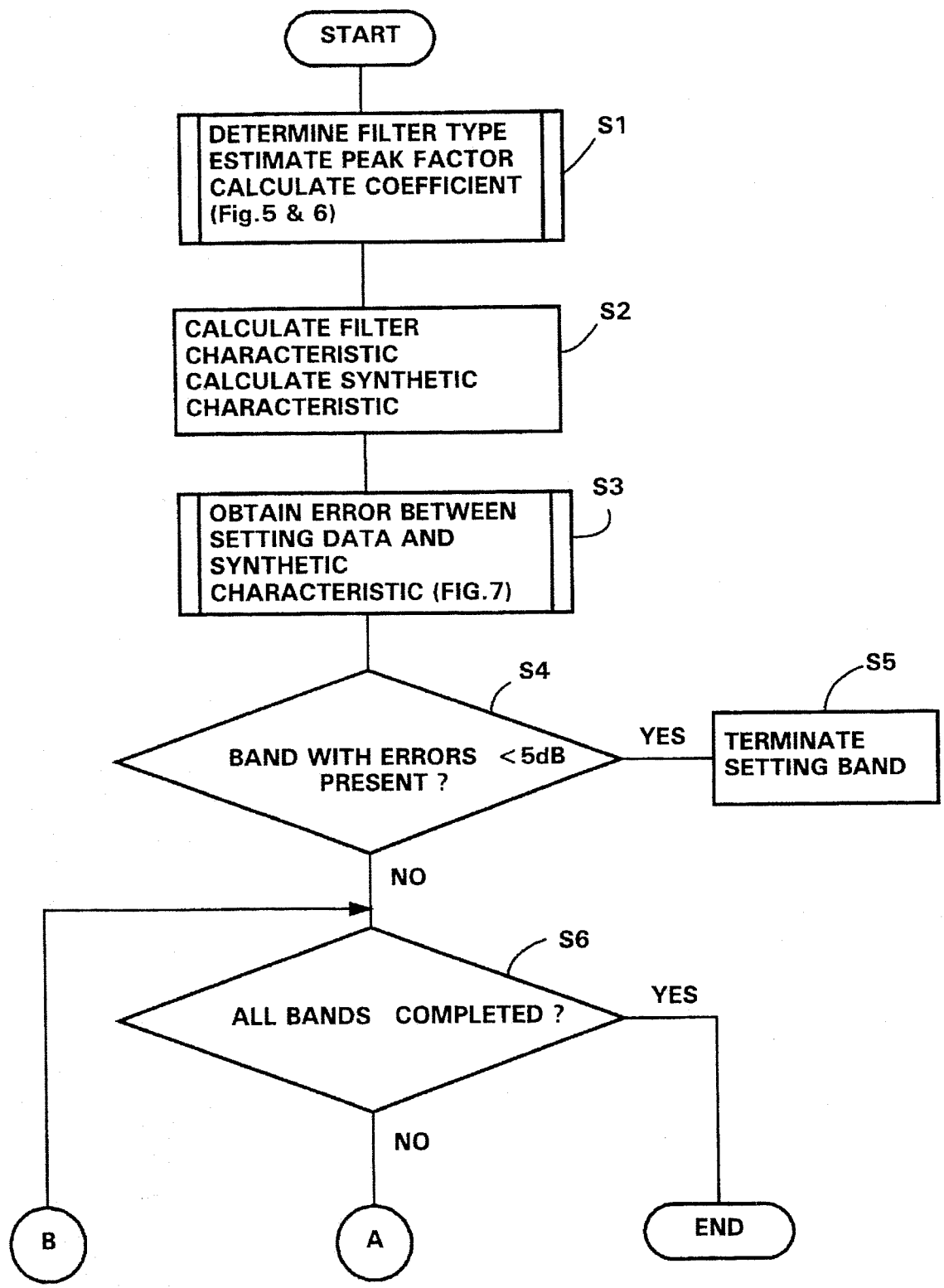
FIGS. 2 to 4 are detailed flow charts illustrating a filter setting process according to the first embodiment.
Figure 3:
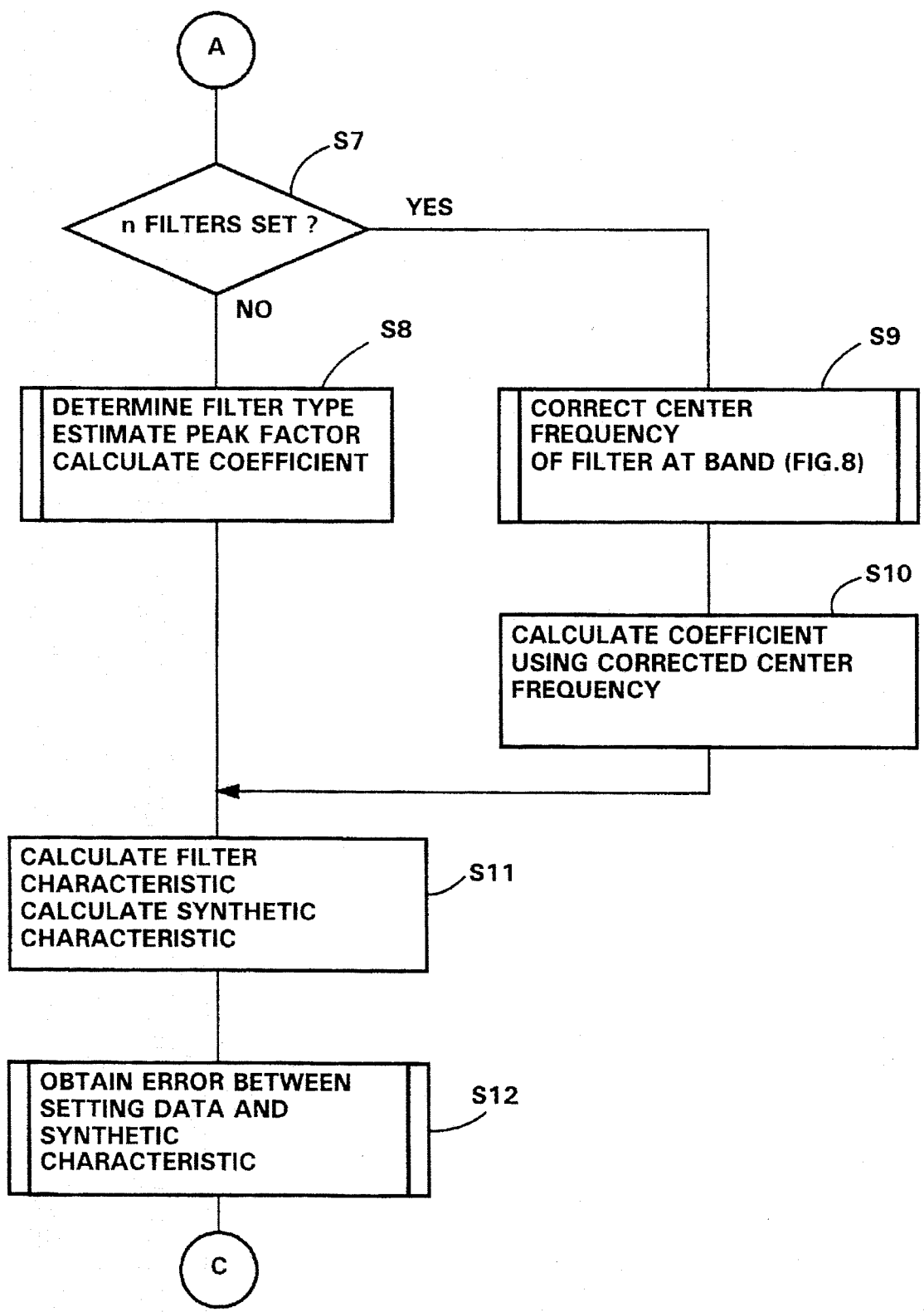
Figure 4:
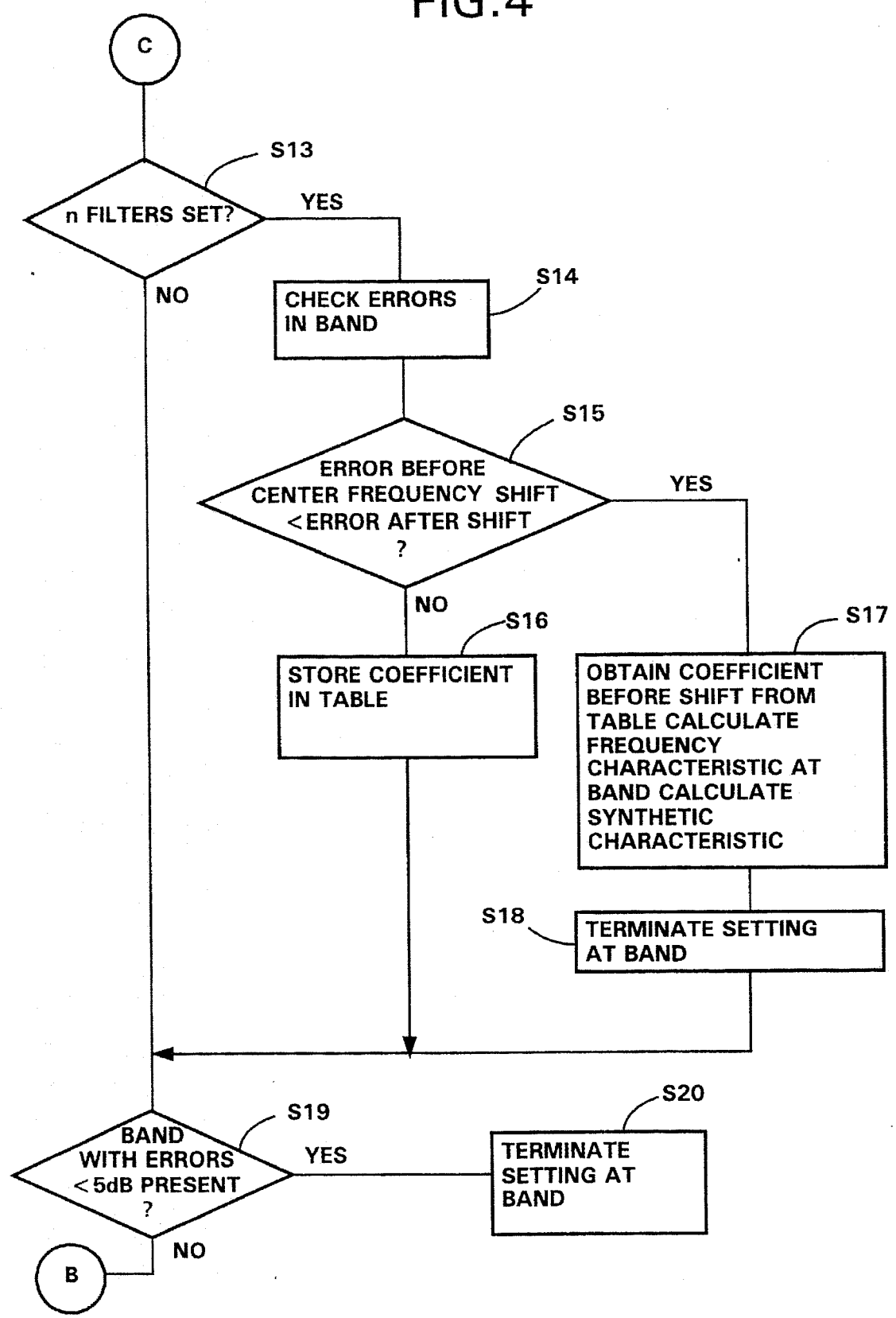

The processes to be executed by the microcomputer 2 for obtaining coefficient parameters of the filter group defining a desired frequency characteristic will be described in detail. When a user inputs setting data for the filer unit such as shown in FIG. 9 as a desired frequency characteristic, from the input unit 1 to the microcomputer 2, the microcomputer 2 performs an initializing operation such as setting all n filters to 0 dB—flat, and starts the filter setting calculation process which will be detailed below. FIGS. 2 to 4 are main flow charts illustrating this process. In accordance with the setting data, one filter is first selected. A filter type (peak filter or notch filter) with a specific center frequency is selected, and the gain and peak factor of the filter of the selected filter are estimated (Step S1).

Figure 5:
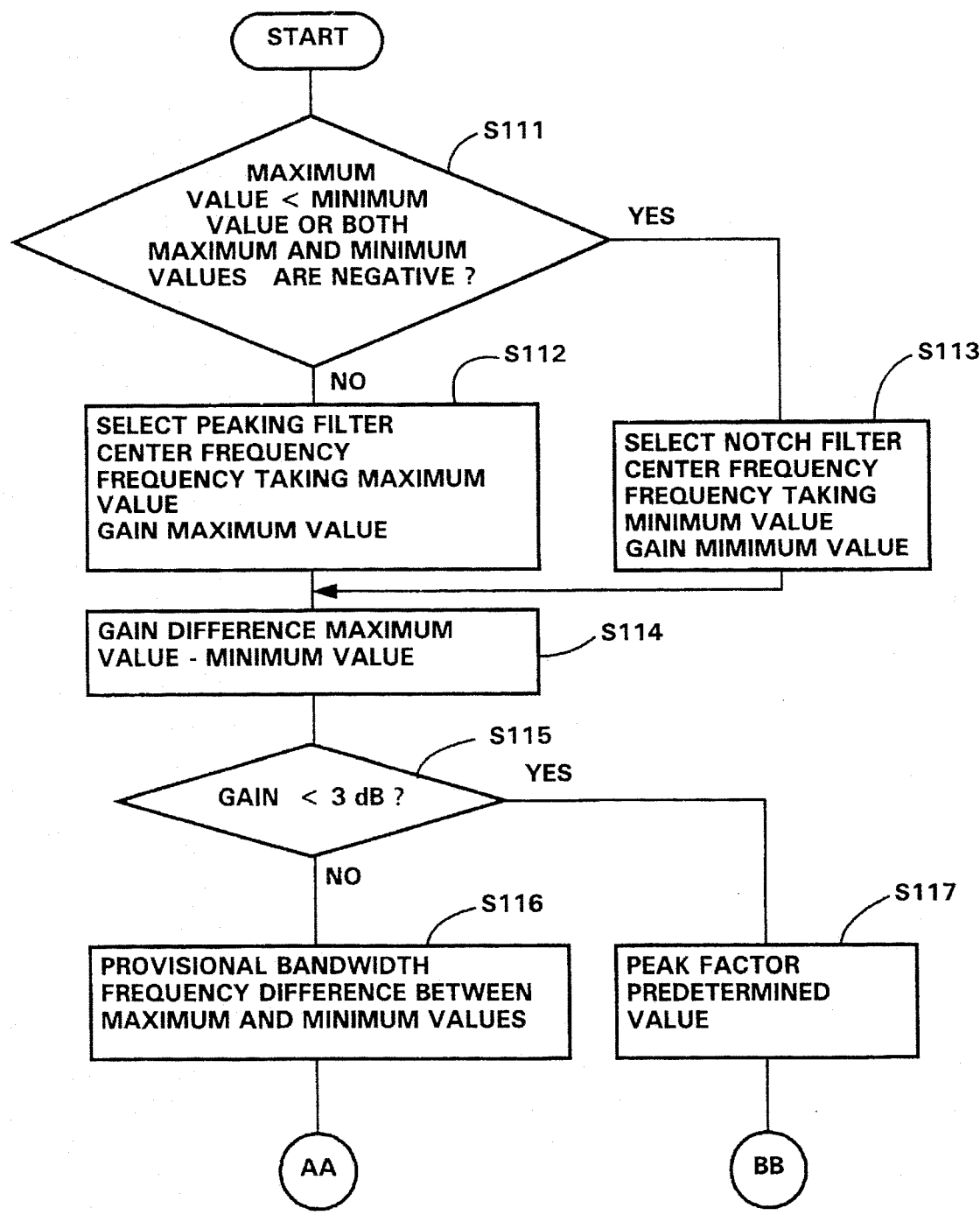
FIGS. 5–6 are detailed flow charts illustrating a peak factor estimating process according to the first embodiment.
Figure 6:
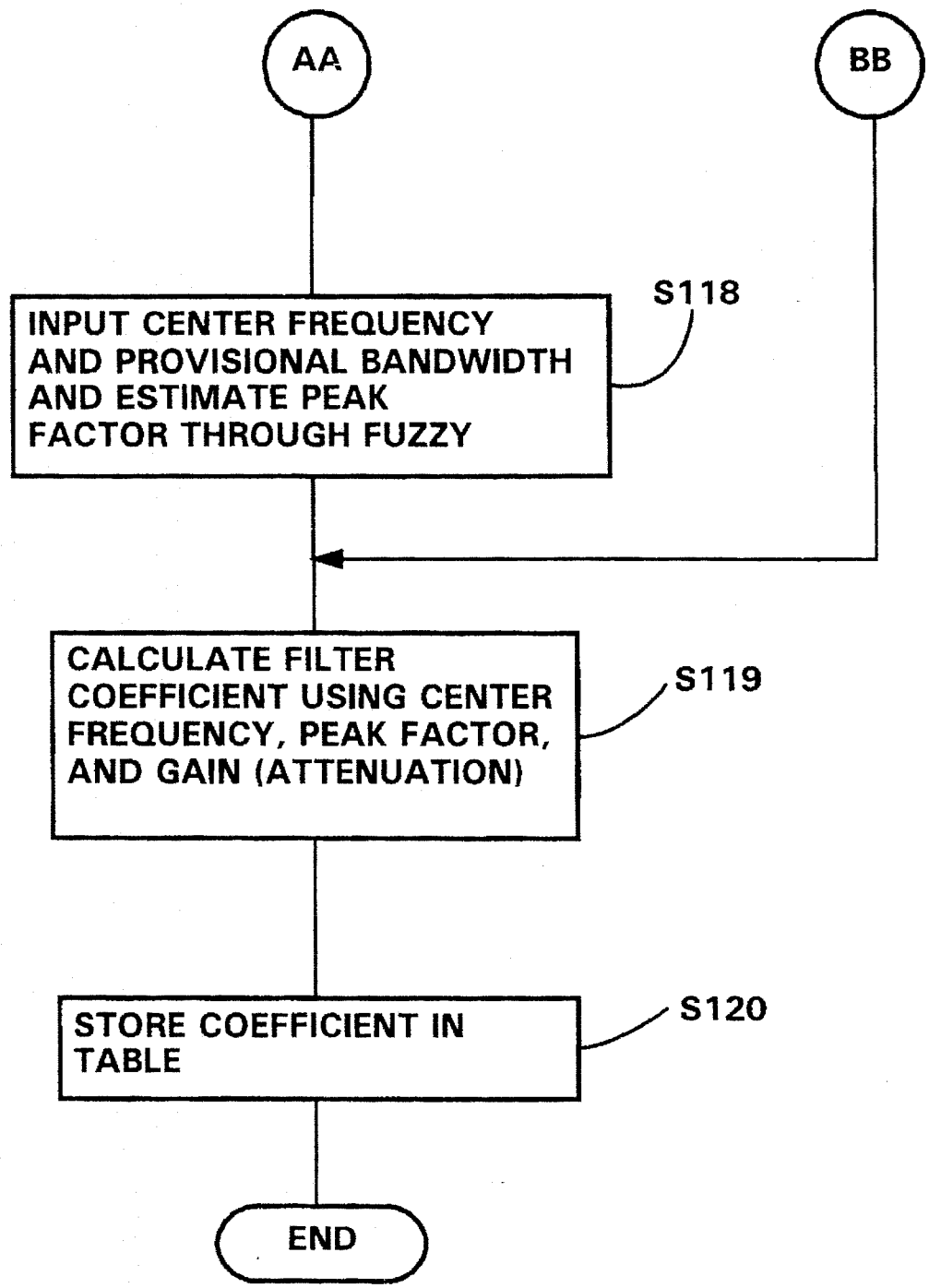

The determination of the filter type, estimation of the peak factor, and calculation of the coefficients at Step S1 are performed at processes illustrated in detail by the flow charts of FIGS. 5 and 6. The setting data is gains which take a positive or negative value such as +8 dB and −6 dB. At Step S111 shown in FIG. 5, all inputted setting data is checked to determine the maximum and minimum values (8 dB and 2 dB in the example of the setting data shown in FIG. 9). It is judged whether one of the conditions that the absolute value of the maximum value is smaller than that of the minimum value and that both the maximum and minimum values are negative, is satisfied. If not satisfied, the filter type is determined as the peaking filter, the center frequency is determined as the frequency taking the maximum value, and the gain is determined as the maximum value of the setting data (Step S112). If satisfied, the filter type is determined as the notch filter, the center frequency is determined as the frequency taking the minimum value, and the attenuation is determined as the minimum value of the setting data (Step S113). After Step S112 or S113, a difference between the maximum and minimum values is calculated to obtain a gain difference (Step S114). In the example of the setting data shown in FIG. 9, the gain difference is (8−2) dB=6 dB. It is checked whether the gain difference is smaller than 3 dB (Step S115). If larger, a provisional bandwidth is obtained as the absolute value of a difference between the frequencies taking the maximum and minimum values (Step S116). If the gain difference is 3 dB, the −3 dB bandwidth of the filter to be set, is set as the provisional bandwidth. Using the center frequency and provisional bandwidth as input values, the peak factor or the −3 dB bandwidth of the filter is estimated through fuzzy estimation or the like (Step S118). Next, filter weight coefficients are calculated from the center frequency, peak factor, gain (attenuation) (Step S119), and stored in the coefficient table (Step S120) to thereafter terminate the process. If the gain difference is judged smaller than 3 dB at Step S115 and the frequency characteristic is relatively flat as a whole, the peak factor is set to a predetermined value (Q=0.25 or 0.5) without calculating it (Step S117), and thereafter executing the process starting from Step S119 shown in FIG. 6.

Figure 7:
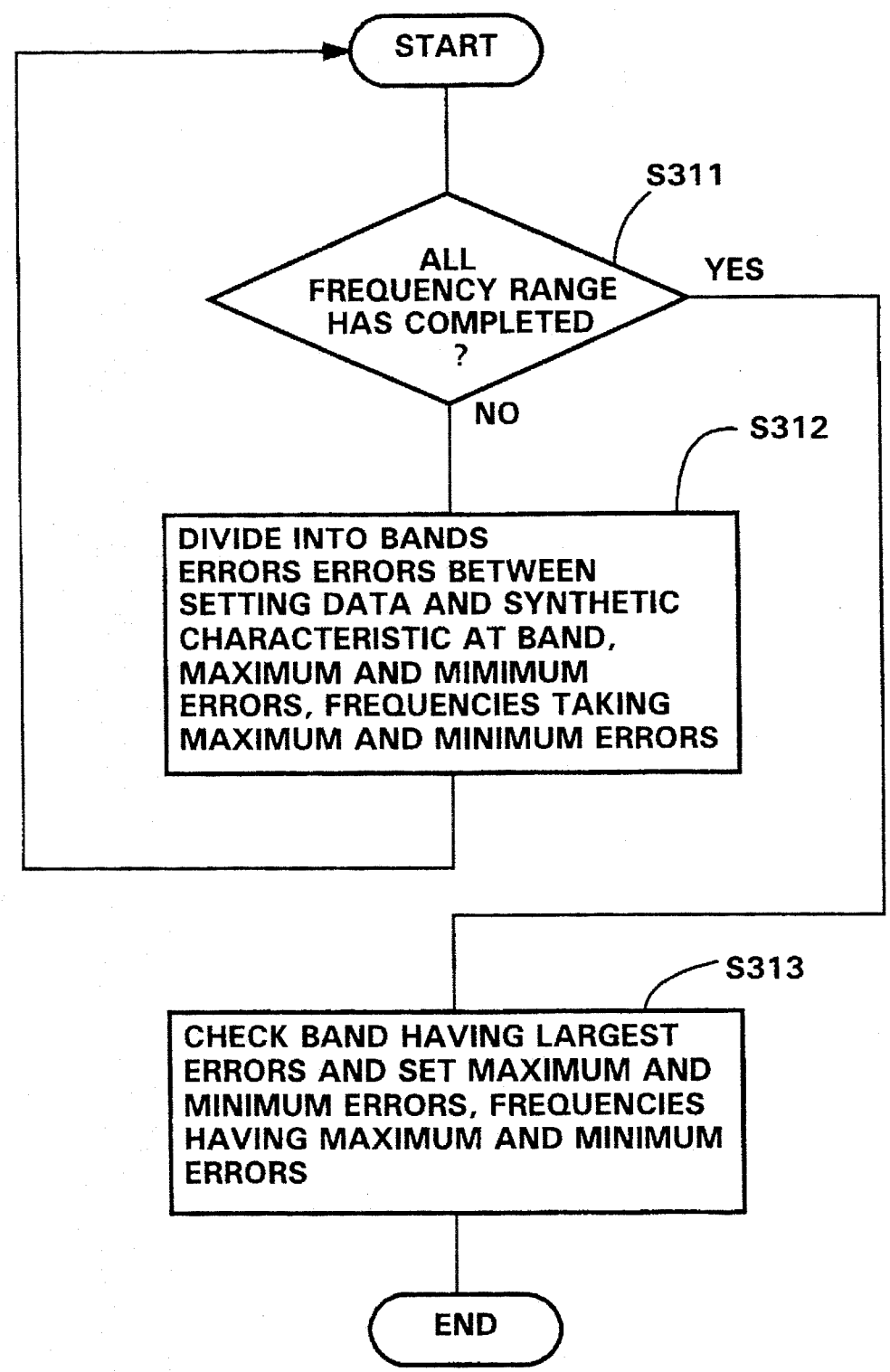
FIG. 7 is a detailed flow chart illustrating an error calculating process according to the first embodiment.

After completion of the process at Step S1 shown in FIG. 2, the frequency characteristic at the full band (60 Hz to 16 KHz) of the peaking filter with the coefficients obtained at Step S1 is calculated to obtain the synthetic characteristic with the (n−1) other filters initialized to 0 dB—flat, and errors of the setting data relative to the synthetic characteristic are calculated (Step S3). The detail of this process is illustrated in FIG. 7. A frequency range to be set is divided into a plurality of bands each band containing three frequency points of the setting data (for example, in FIG. 9 one frequency band is constituted by 60 Hz–120 Hz–250 Hz). Errors at each band are obtained by a difference between the setting data and the synthetic characteristic. Namely, a difference between the synthetic characteristic inclusive of the estimated filter and the setting data is evaluated not at each frequency point but by at each frequency band. First, it is checked whether all the frequency range to be set has been completed (Step S311). If not, the band division is effected to obtain the errors over the whole area of each band, the maximum and minimum error values, and the frequencies taking the maximum and minimum error values (Step S312), to thereafter return to Step S311. If all the frequency range has been completed at Step S311, the band having the largest error is checked to obtain the maximum and minimum error values and the frequencies having the maximum and minimum error values of the band having the largest error (Step S313). In estimating the second filter to be added to the first filter thus set, not the setting data used for the estimation of the first filter but the error values are considered for the further correction of errors between the synthetic characteristic and the setting data.

At Step S3 shown in FIG. 2, the errors between the setting data and the synthetic characteristic are obtained. At Step S4 it is checked whether there is a band with all errors smaller than a predetermined value (in this example, 5 dB). If present, the filter setting for this band is terminated (Step S5), whereas if not present, it is checked whether all bands have been set (Step S6). If all bands have been set at Step S6, the process is terminated, whereas if not, it is checked whether the n filters have been set (Step S7). If the n filters have not set still and if there is any filter in the filter unit which can be set, the type, peak factor, and coefficients of the second filter to be added, are calculated in the manner like Step S1 (Step S8). The maximum and minimum values and center frequency for this calculation are obtained from the errors of the divided band. If the n filters capable to be set in this embodiment have been already set at Step S7, it is not possible to add a filter. In this case, the center frequency of the set band filter is corrected in the manner to be described later with FIG. 8 (Step S9), and the coefficients are calculated using the corrected center frequency (Step S10). Namely, if there is no filter to be added and set, the center frequency is corrected to make the synthetic characteristic to become near the setting data. If there is a filter to be added and set, the filter to be added is estimated at Step S8, and the set band characteristic of the second filter and the synthetic characteristic are calculated (Step S11). The errors of the calculated synthetic characteristic relative to the setting data are calculated in the manner like Step S3 (Step S12).

Next, as shown in FIG. 4, it is checked whether the n filters have been set (Step S13). If set, the center frequency of the filter is corrected and the coefficients are calculated at Steps S9 and S10. The errors at the band underwent the center frequency correction are checked. Thereafter, it is checked whether the errors before the center frequency correction is smaller than the errors after the correction (Step S15). If not, the filter coefficients are stored in the coefficient table (Step S16), whereas if smaller, the coefficients before the correction are obtained from the coefficient table to calculate the frequency characteristic of the set filter and the synthetic characteristic (Step S17). If all the filters have not been set at Step S13, it is checked for synthetic characteristic including the second filter calculated at Step S8, whether there is a band having all errors smaller than 5 dB (Step S19). If there is a band, the setting for this band is terminated (Step S20). If not, the process sequence returns to Step S6 shown in FIG. 2. This loop continues until the errors of the synthetic characteristics of the estimated filters at all the bands become smaller than the predetermined value (5 dB) relative to the setting data.

If all the n filters capable of being set has been used already and there is no filter to be added for changing the synthetic characteristic to have as near the setting values as possible, then the center frequency of the filter already set is corrected. The center frequency correction at Step S9 shown in FIG. 3 is performed following the sequence shown in the flow chart of FIG. 8. After storing the errors over the whole range of the band and the center frequency of the filter to which the center frequency correction is to be performed (Step S911), a correction amount is estimated through the fuzzy estimation to be described later, by using as the input value the result of subtraction of the absolute value of (center frequency—frequency taking the maximum error) by the absolute value of the maximum error (Step S912). Namely, the center frequency of the filter set as the frequency taking the maximum value of the setting data is shifted to the frequency having the maximum error of the synthetic characteristic. It is judged whether the maximum error is positive or negative. If negative, it is checked whether the result of subtraction of the frequency taking the maximum error by the center frequency is positive or negative (Step S914). If negative, the new center frequency is set to the value obtained by subtracting the correction amount from the previous center frequency (Step S915), whereas if positive, the new center frequency is set to the value obtained by adding the correction amount to the previous center frequency (Step S916). If it is judged at Step S913 that the maximum error is positive, it is checked whether the result of subtraction of the frequency taking the maximum error by the center frequency is positive or negative (Step S917). If negative, the new center frequency is set to the value obtained by adding the correction amount to the previous center frequency (Step S918), whereas if positive, the new center frequency is set to the value obtained by subtracting the correction amount from the previous center frequency (Step S919).

Figure 8:
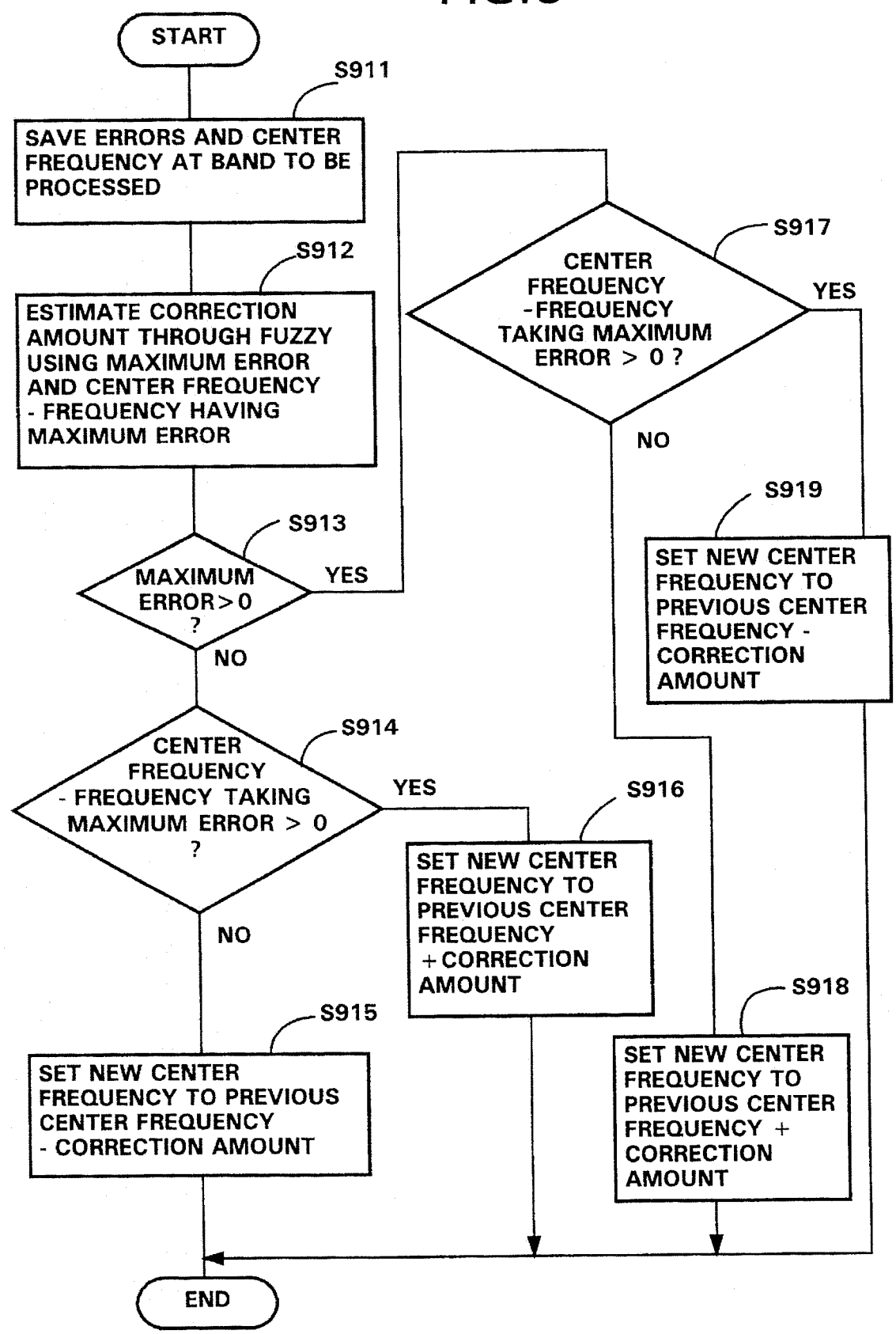
FIG. 8 is a detailed flow chart illustrating a center frequency correcting process according to the first embodiment.

The center frequency is corrected by the process sequence illustrated in FIG. 8 as described above (Step S9). At Step S10, the filter coefficients are again calculated in accordance with the corrected center frequency. The synthetic characteristic is obtained using the filter characteristic calculated at Step S10. At Step S12, the errors of the synthetic characteristic relative to the setting data are obtained at Step S12. At Steps S14 to S18, it is checked which of the center frequencies before and after the correction is more suitable, and the filter coefficients calculated basing upon the more suitable one are selected.

With the above-described processes, the filter coefficients capable of providing a desired frequency characteristic designated by a user can be stored in the coefficient table. The microcomputer 2 sends the data in the coefficient table to the interface unit 3 to set the filters of the variable filter unit 4.

Example of Calculation

Given the setting data shown in FIG. 9, the setting data is checked to obtain the maximum and minimum values and the frequencies taking the maximum and minimum values. In this example, the maximum value is 8 dB, the frequency taking the maximum value is 60 Hz, the minimum value is 2 dB, and the frequency taking the minimum value is 120 Hz. At Step S1 shown in FIG. 2, the filter type becomes the peaking filter, the center frequency becomes 60 Hz, and the gain becomes 8 dB. Since the gain difference (8−2)=6 dB is larger than 3 dB, the provisional bandwidth is determined as 120−60 =60 Hz, and the center frequency is determined as 60 Hz. Using these values as the input values, the peak factor of the filter is estimated through the fuzzy estimation. This estimation provides the peak factor of 1.08. The filter coefficients are calculated from the center frequency 60 Hz, peak factor 1.08, and gain 8 dB. The calculated coefficients are stored in the coefficient table. The −3 dB bandwidth of this filter is 60/1.08=55.6 Hz. The calculated synthetic characteristic is shown in FIG. 10.

At Step S3 shown in FIG. 2, the errors of the synthetic characteristic from the setting data are obtained. A single band is defined by the frequency range of three setting frequency points. In this example, the low band is 60−120−250 Hz, the middle band is 500−750−1 kHz, and the high band is 4k−8k−16 kHz. In each of these divided bands, the errors between the setting values and estimated filter characteristic are obtained.

The band having the largest error is the high band. Therefore, the second filter is estimated using the setting data at the high band. The setting data in the high band includes the maximum value (maximum error value) 7 dB, minimum value (minimum error value) 7 dB, frequency 4 kHz taking the minimum value, and frequency 4 kHz taking the maximum value. All the bands have not been set at Step S6 and only one filter has set at Step S7 (n is the maximum number of filters capable of being set). Therefore, the peak factor estimation process shown in the flow chart of FIGS. 5 and 6 is performed at Step S8. After this process, the set values are the center frequency 4 kHz, peak factor 0.25, and gain 7 dB. The frequency characteristic of the set filter is shown in FIG. 11.

Figure 12:
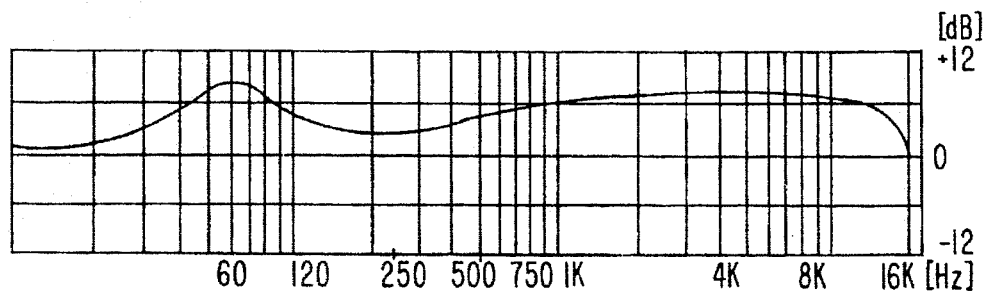
FIG. 12 shows the synthesized frequency characteristic of the first and second set filters.

FIG. 12 shows the synthetic characteristic of the frequency characteristic of the second filter calculated at Step S11 shown in FIG. 11, the frequency characteristic of the first filter shown in FIG. 10, and the frequency characteristic of the remaining (n−1) filters of 0 dB—flat.

Figure 13:
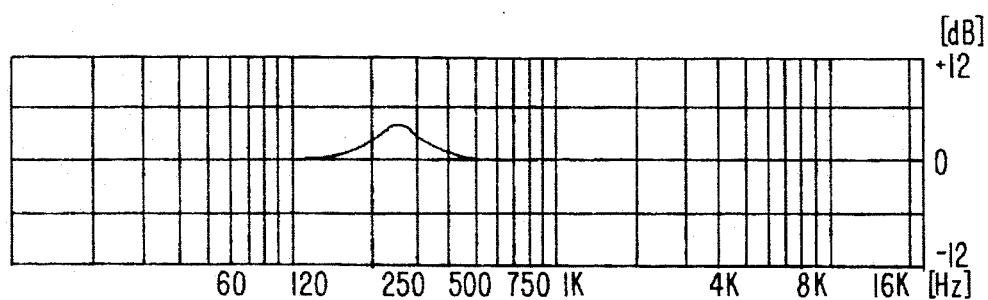
FIG. 13 shows the frequency characteristic of the third set filter according to the first embodiment.
Figure 14:
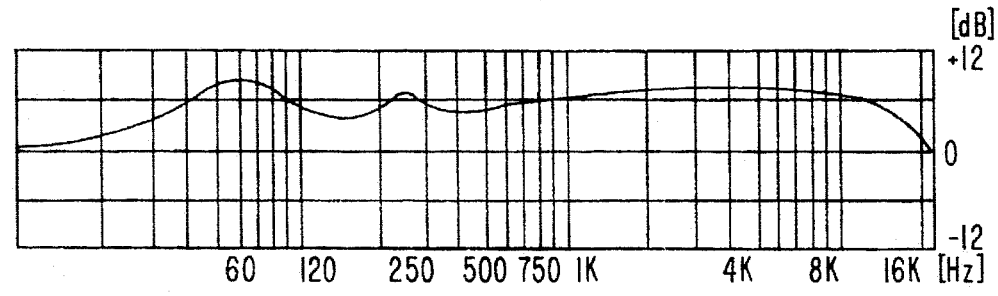
FIG. 14 shows the synthesized frequency characteristic of the first to third set filters.
Figure 15A:
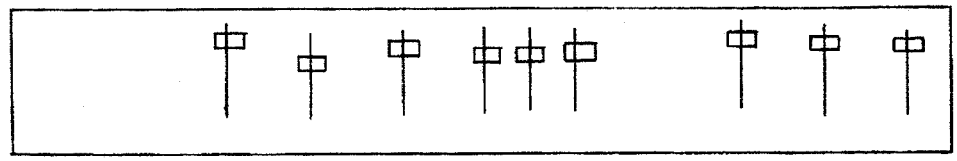
FIGS. 15A and 15B show an example of the synthesized frequency characteristic of a conventional equalizer.
Figure 15B:
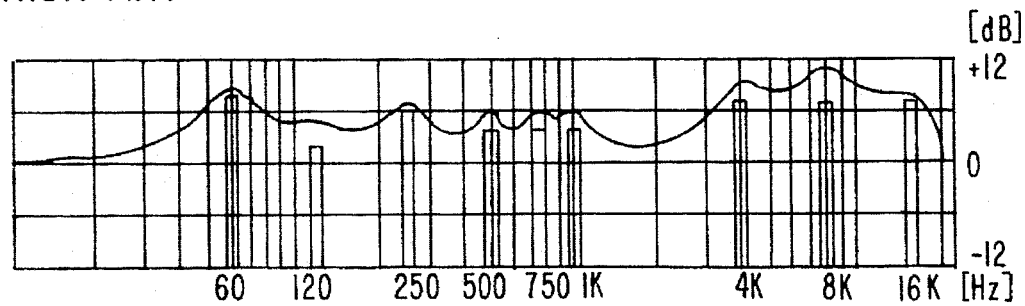

Next, at Step S12, the errors between the setting data shown in FIG. 7 and the synthetic characteristic shown in FIG. 12 are obtained. Assuming that there remains a filter capable of being set at Step S13, the band having the largest error of 5 dB or larger is the middle band (Step S19). Therefore, the third filter is estimated using the setting data of the middle band. The data used for the third filter includes therefore the maximum value 4 dB, minimum value 0 dB, frequency 350 Hz taking the maximum value, and frequency 500 Hz taking the minimum value. The process sequence returns from Step S19 back to Step S6. Since all the bands have not been set and only two filters have set, the estimation process for the third filter is performed at Step S8 detailed in FIGS. 5 and 6. At this process, the estimated values are the center frequency 250 Hz, peak factor 1.18, and gain 4 dB. The frequency characteristic of this filter is shown in FIG. 13. FIG. 14 shows the synthetic characteristic of the first to third estimated filters obtained at Steps 11 and 12 and the characteristic of the remaining (n−3) filters. The errors at all the bands obtained at Step S12 are 5 dB or smaller (Step S19), and so the setting at all the bands is terminated (Step S6—END). In this example, at the time when the setting is completed, the coefficients data for three filters have been stored in the coefficient table. The remaining filters have the characteristic initialized to 0 dB. The succeeding operation of the microcomputer is the same as described previously.

SECOND EMBODIMENT

In the first embodiment, the peak factor (Q) of each selected filter is estimated from the center frequency and provisional bandwidth (a difference between frequencies taking the maximum and minimum gains of the setting data). In the second embodiment, the peak factor (Q) is estimated while taking into consideration a difference between the maximum or minimum gain value and the gain value at a setting frequency point near the maximum or minimum gain value. The structure of the apparatus of the second embodiment is the same as that shown in FIG. 1, and the main flow of the filter setting process is shown in FIGS. 16 to 19.

Main flow (FIGS. 16 to 19)

Figure 16:
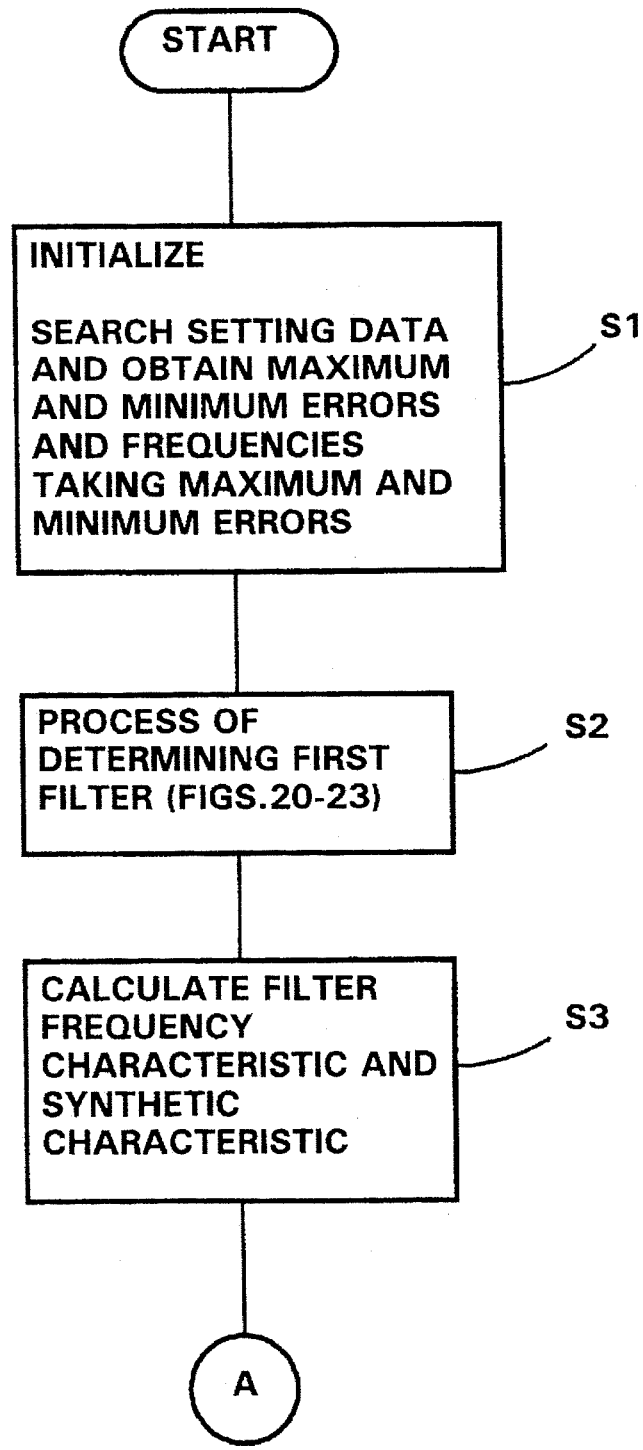
FIGS. 16 to 19 are flow charts illustrating the filter setting process according to a second embodiment.
Figure 17:
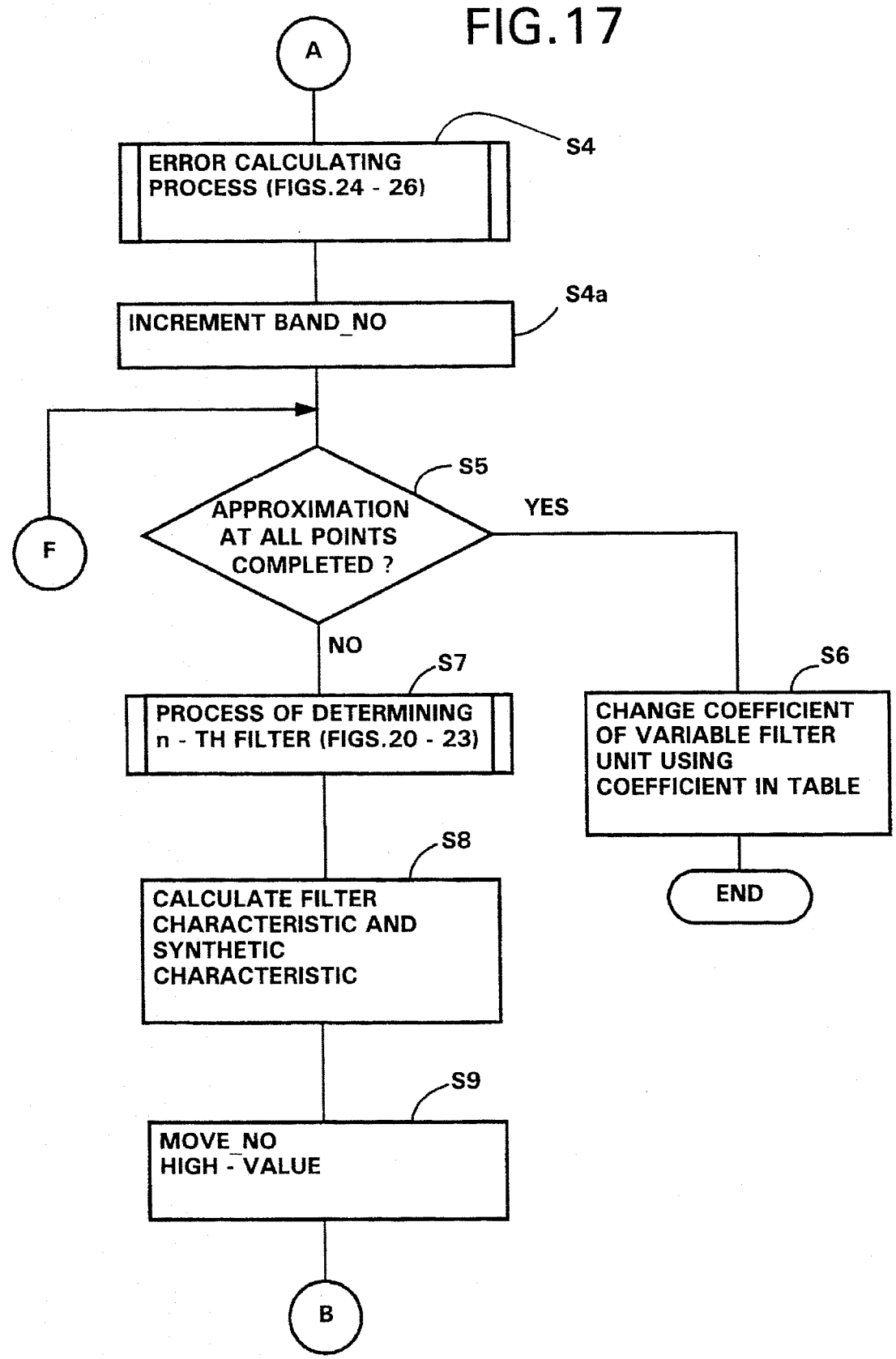
Figure 18:
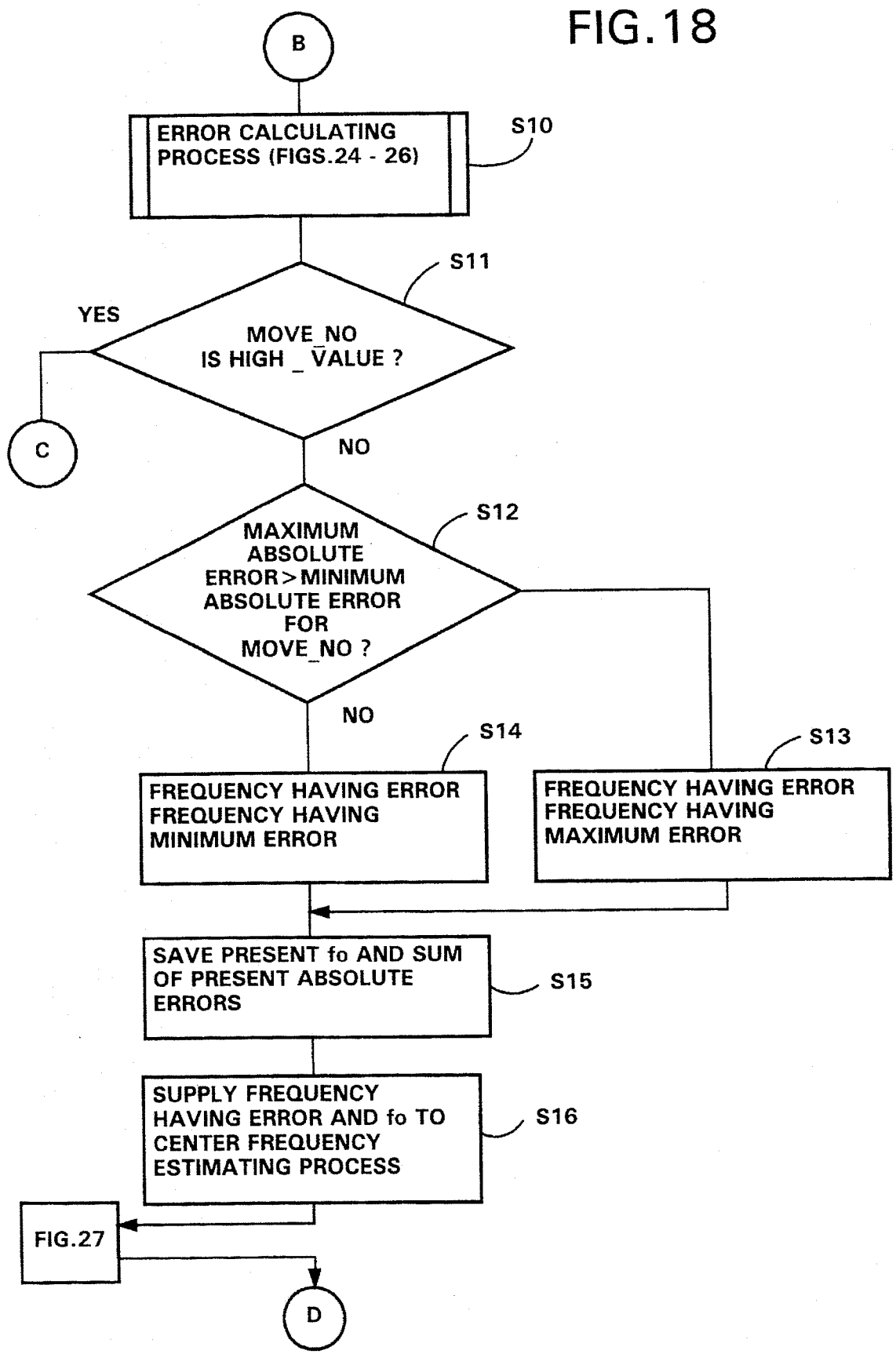
Figure 19:
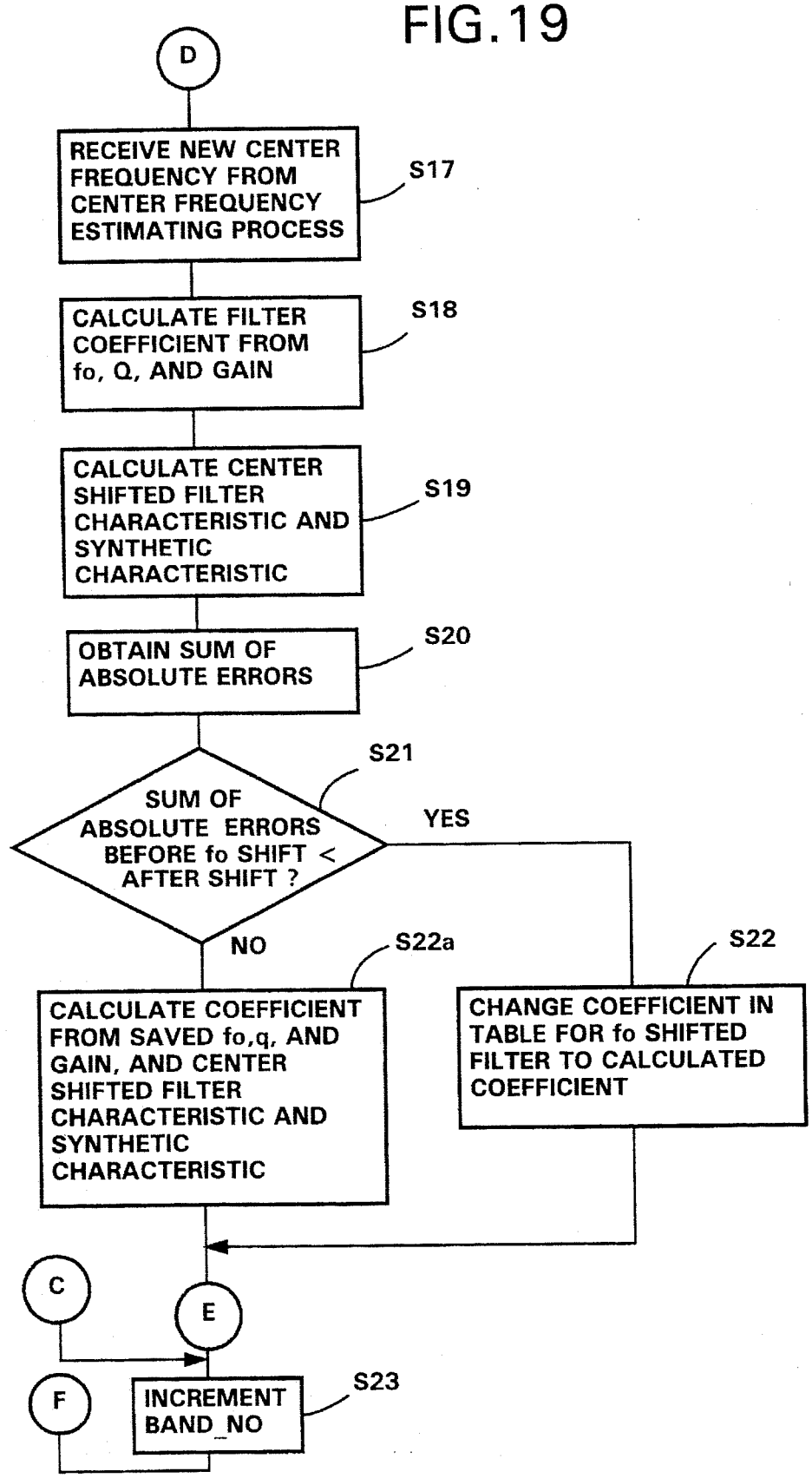

At Step S1 shown in FIG. 16, all the setting data is checked to determine the maximum and minimum values, and frequency (MAX_F) taking the maximum value, and frequency (MIN_F) taking the minimum value. If the maximum and minimum values are present at a plurality of setting frequency points, the lowest frequency points are used as MAX_F and MIN_F. Assuming the setting data is present at nine setting frequency points such as shown in FIG. 30, the maximum value is 8 dB, the minimum value is 2 dB, the frequency MAX_F taking the maximum value is 60 Hz, and the frequency MIN_F taking the minimum value is 120 Hz. Next, the filter determining process is executed (Step S2). The detail of Step S2 is shown in FIGS. 20 to 23 which will be described later.

At Step S2, using the determined maximum and minimum values and MAX_F and MIN_F, the filter coefficient parameters including the center frequency (fo), peak factor (Q), and gain or attenuation (GAIN) are determined. The detail of this determining process will be described later with reference to the flow charts of FIGS. 20 to 23. In accordance with the coefficient parameters determined at Step S2, the filter coefficients of the filter identified by a setting filter number BAND.NO are calculated and stored in the coefficient table. In the example of the setting data shown in FIG. 30, as the result of the filter determining process at Step S2, there are obtained the coefficient parameters of the first filter BAND_NO=0 which are fo =60 Hz, Q=1.75, and GAIN=8 dB.

Next, the frequency characteristic of the set filter BAND_NO=0 and the synthetic characteristic are calculated (Step S3). For the example of the setting data shown in FIG. 30, an example of the synthetic characteristic of the first filter BAND_NO=0 is shown in FIG. 31.

Figure 24:
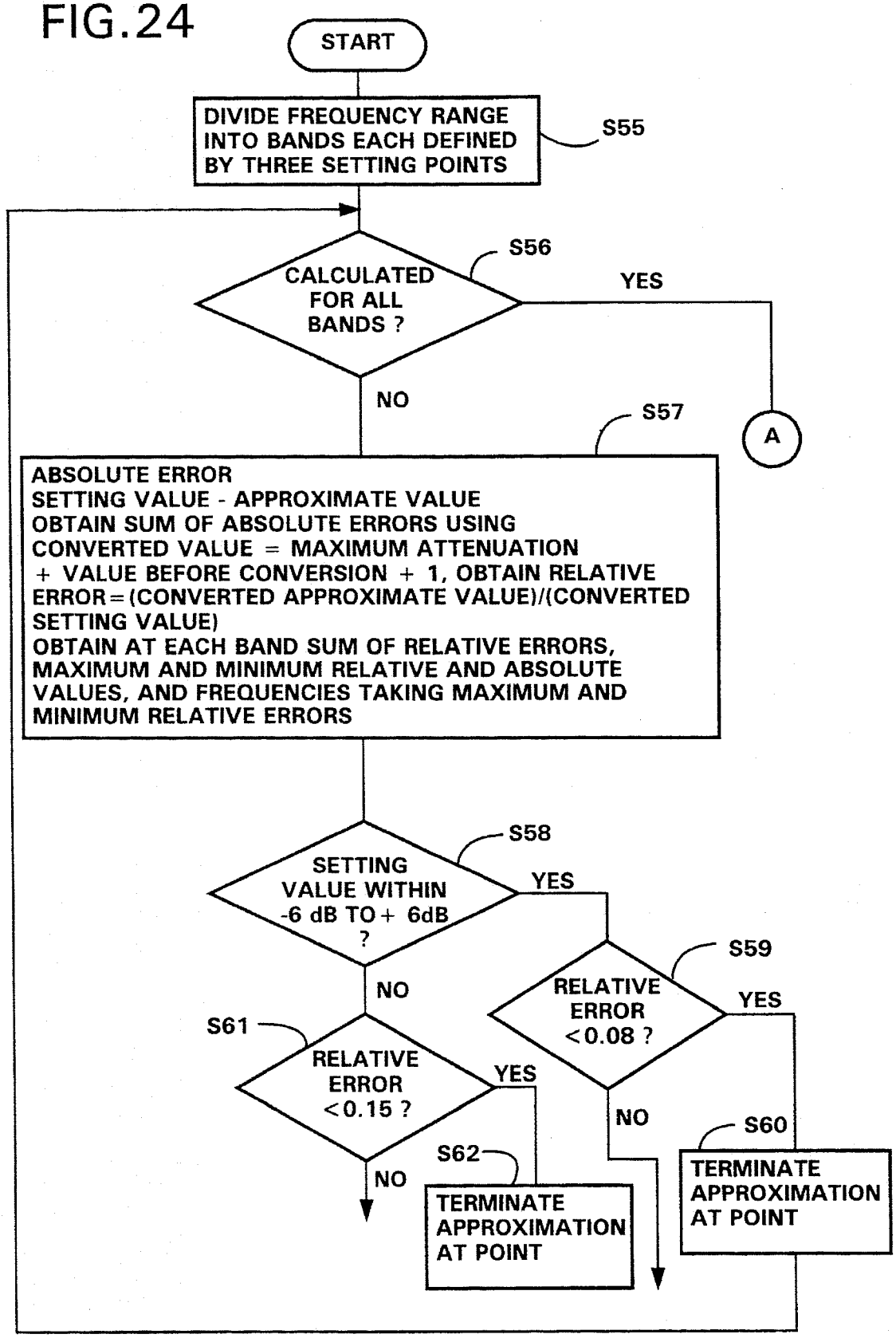
Figure 25:
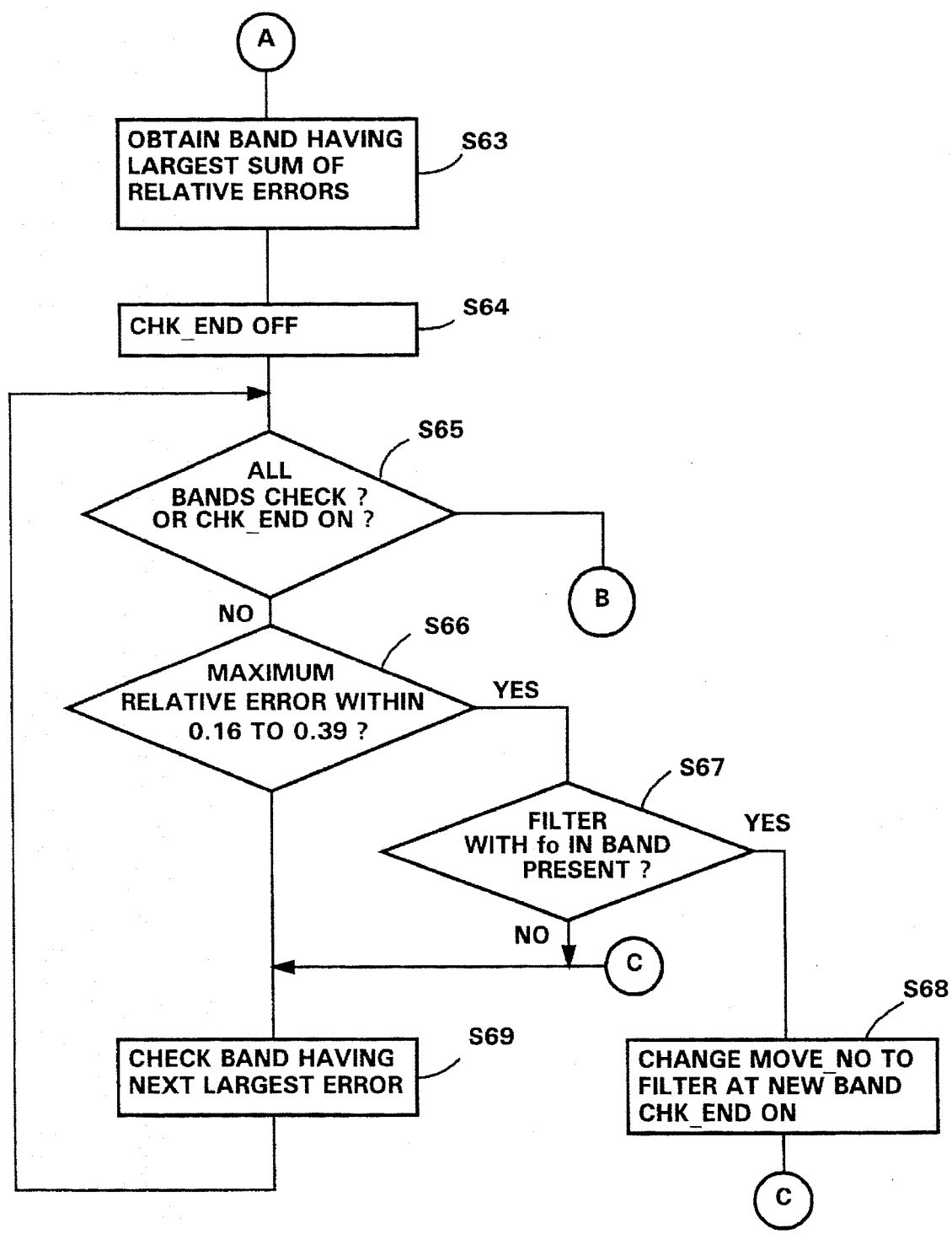
FIGS. 25 and 26 are detailed flow charts illustrating the error calculating process according to the second embodiment.
Figure 26:
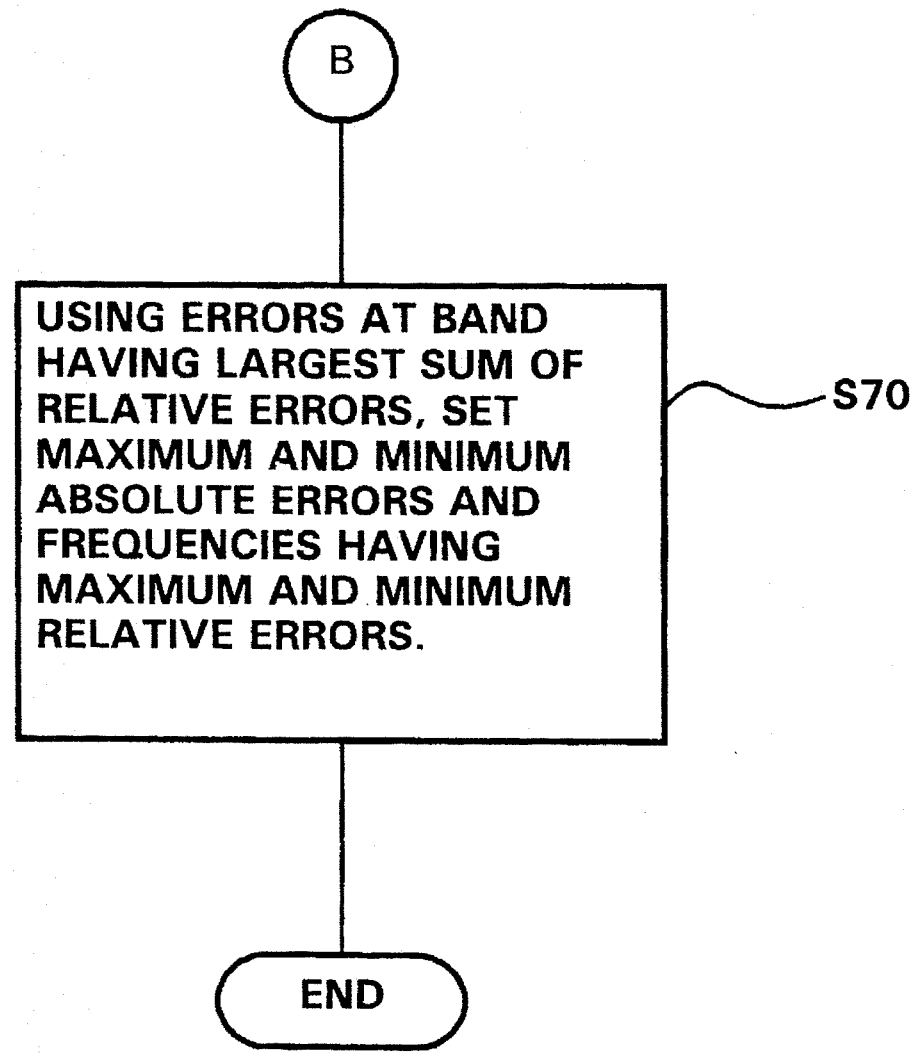

Next, at Step S4 (detail of which is shown in FIGS. 24 to 26), an error calculating process is performed using the synthetic characteristic of the set filter and the setting data. At the error calculating process, the characteristic values at the setting frequency points of the calculated synthetic characteristic are used as approximate values. Next, the synthetic characteristic is divided into bands each defined by three setting frequency points, and the errors in each band are evaluated. As the errors between the setting values and approximate values, the following values are obtained.

Absolute value = setting value − approximate value (1)

Converted value = maximum attenuation value + value before conversion + 1 (2)

-continued $$\text{Relative error} = 1.0 - (\text{converted approximate value})/(\text{converted setting value}) \quad (3)$$

The maximum attenuation value is the maximum attenuation value capable of being set to a filter. In this embodiment, this value is −12 dB. The absolute error given by the equation (1) is a magnitude of the error between the setting value and the synthetic characteristic (approximate value) at a setting frequency point. The relative error given by the equation (3) is a value used for evaluating the error basing upon a ratio of the magnitudes of the setting value and approximate value relative to the maximum attenuation value (−12 dB) calculated by the equation (2). For example, if the approximate value is 6 dB and the setting value is 5 dB, it becomes that the absolute error=5−6=−1 dB, the converted setting value=−12 +5+1=18, the converted approximate value=−12 +6+1=19, and the relative error= 1.0−19/18=−0.056.

It is then checked if the setting value is within the range from −6 dB to +6 dB at each setting frequency point. If within the range and the setting frequency characteristic is relatively flat and if the relative error is 0.08 or smaller, the approximation at the setting frequency point is terminated. On the other hand, if the setting value is outside the range from −6 dB to +6 dB and if the relative error is 0.15 or smaller which is a relatively large reference, the approximation at the setting frequency point is terminated. A band having the maximum sum of relative errors at setting frequency points is then obtained to set the maximum value to the maximum absolute error, the minimum value to the minimum absolute error, MAX_F to the setting frequency taking the maximum relative error, and MIN_F to the setting frequency taking the minimum relative error. In the determination of the first filter BAND_NO=0, the setting data is used. However, in the determination of the second and following filters, the errors between the synthetic characteristic of the set filters and the desired equalizer characteristic are used. At Step S4, the errors are calculated, and values necessary for the following Steps are set.

For the example of the setting data shown in FIG. 30, it becomes that the maximum value is 8 dB, minimum value is 8 dB, MAX_F is 8 kHz, and MIN_F is 8 kHz, the detail of this process being described later.

Figure 33:
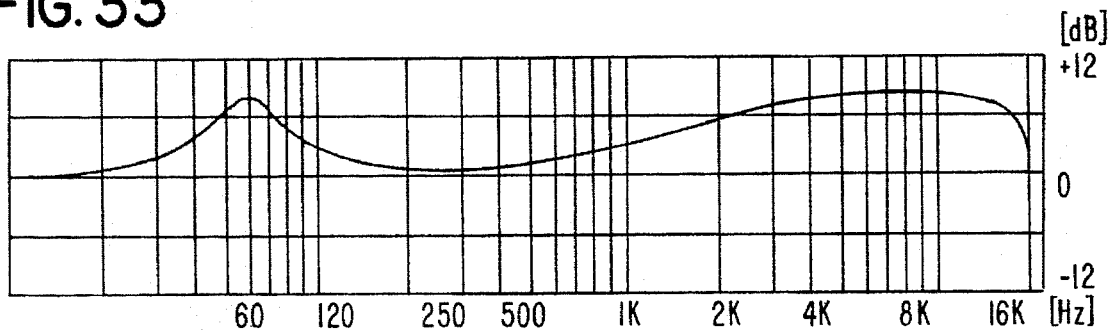
FIG. 33 shows the synthetic characteristic of the first and second set filters.

Next, in the filter setting calculating main flows, BAND_NO is incremented to "1" indicating the second filter. It is then checked whether the approximation at all setting frequency points has been completed (Step S5). If completed, the coefficients of the filter in the variable filter unit are changed in accordance with the coefficients in the coefficient table (Step S6). In this case, the filter setting process is terminated. If not completed, the filter determining process is executed for the filter BAND_NO=1 in the manner like Step S2. At Step S7, in the example of the setting data shown in FIG. 30, there are obtained fo=8 kHz, Q=0.5, and GAIN=8 dB as the coefficient parameters of the second filter BAND_NO=1, basing upon the minimum and maximum values, MAX_F, and MIN_F. Next, the frequency characteristic of the filter BAND_NO=1 and the synthetic characteristic are calculated (Step S8). The frequency characteristic of the second filter BAND_NO=1 in the example of the setting data shown in FIG. 30 is shown in FIG. 32, and the synthetic characteristic of the filters BAND_NO=0 and BAND_NO=1 is shown in FIG. 33.

After setting the first and second filters, the center frequency of the first or second filter set to the setting frequency point having the maximum gain, minimum attenuation, or maximum error, is shifted, and it is checked whether the frequency shift provides a better result. To this end, MOVE_NO of the filter BAND_NO whose center frequency is shifted is set to HIGH_VALUE (Step S9). This setting is performed so as to allow the judgement of center frequency shift at the following Steps. The error calculating process is executed for the synthetic characteristic shown in FIG. 33 and the setting characteristic (Step S10). In the example shown in FIG. 30, the result of the error calculating process shows that the maximum value=6 dB, minimum value=0 dB, MAX_F=250 Hz, MIN_F=60 Hz, and the sum of the absolute errors is 16 dB. MOVE_NO is set to "0" to shift the center frequency of the first filter. It is then checked whether MOVE_NO is HIGH_VALUE (Step S11). If MOVE_NO Is HIGH_VALUE, the process sequence jumps to Step S23. If not, it is judged whether the absolute value (e.g., 3) of the maximum absolute value (3 dB) of the filter identified by MOVE_NO is larger than the absolute value (e.g., 8) of the minimum absolute value (−8 dB) (Step S12). If larger, the setting frequency taking the maximum error is used as a frequency f* having an error (Step S13). If not larger, the setting frequency taking the minimum error is used as a frequency f* having an error (Step S14). In this manner, the frequency f* having the maximum error is determined within the band at which the center frequency is shifted.

Next, the present center frequency fo and the sum of the absolute errors obtained by the error calculating process are saved (Step S15). The frequency having an error and fo are passed to a center frequency estimating process shown in FIG. 27 (Step S16). In the center frequency estimating process, a new fo is estimated from the setting value, approximate value, and relative error at the received frequency f* having the maximum error, and the new fo is returned to the control process. The detail of the center frequency estimating process will be described later with reference to FIG. 27.

Figure 27:
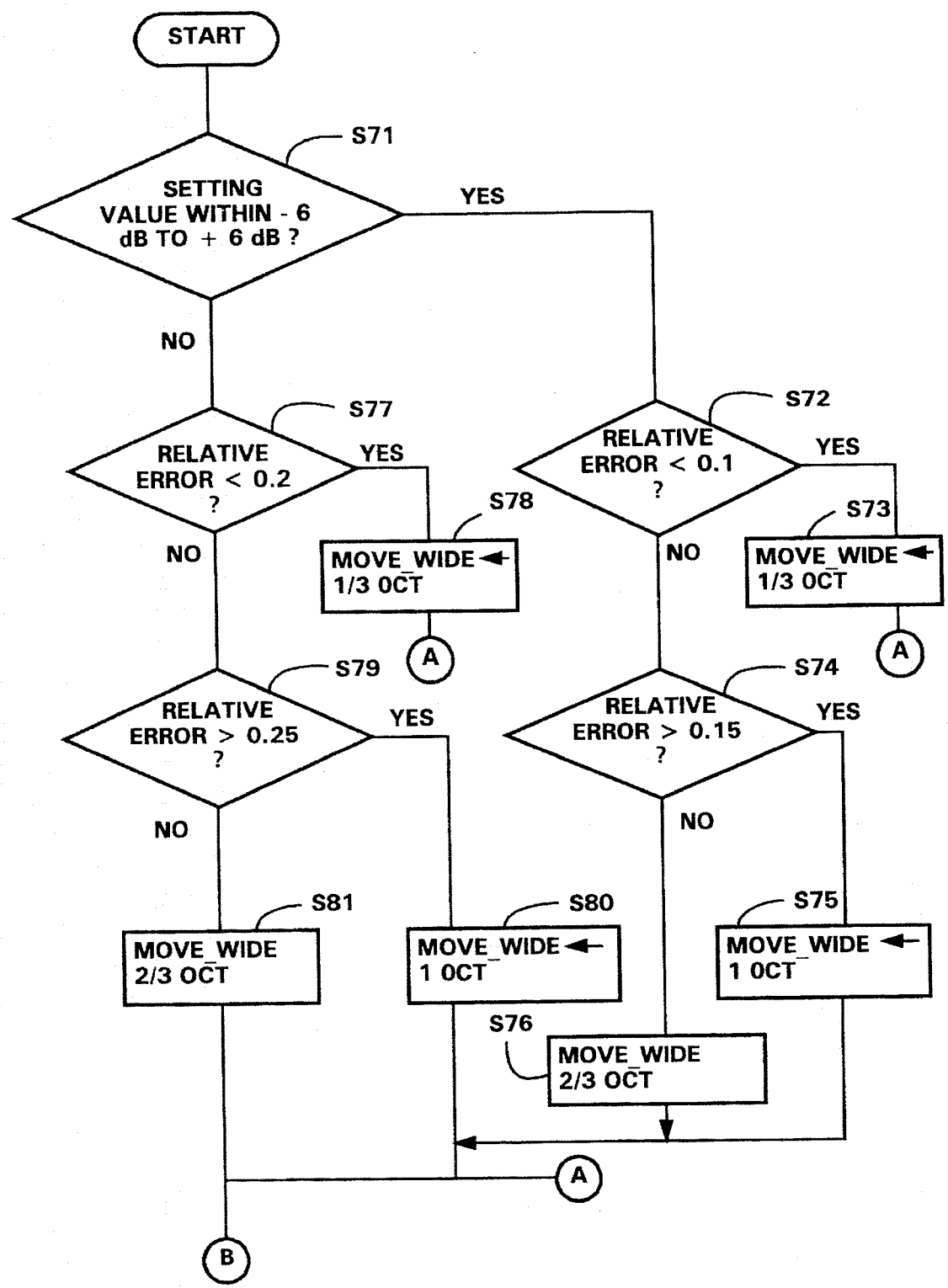
FIGS. 27 and 28 are detailed flow charts illustrating a center frequency estimating process according to the second embodiment.
Figure 34:
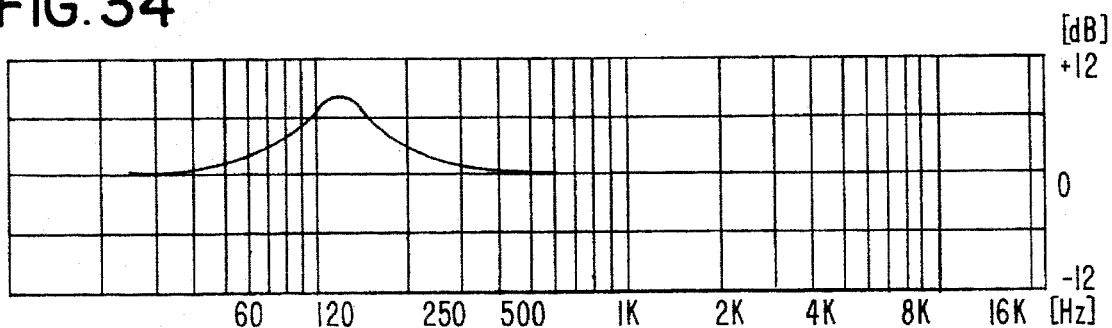
FIG. 34 shows the characteristic with the shifted center frequency of the first filter of the second embodiment.

In the example of the setting data shown in FIG. 30, the frequency f* having the maximum error is 250 Hz, and the initial center frequency is fo=60 Hz. In this case, the new center frequency estimated at the center frequency estimating process shown in FIG. 27 is fo=120 Hz. The filter determining calculating flow receives this new fo from the center frequency estimating process (Step S17). The filter coefficients are calculated from the new f0, peak factor Q and GAIN of the filter identified by MOVE_NO (Step S18). The characteristic of the shifted filter identified by MOVE_NO and the synthetic characteristic are calculated (Step S19). For the example of the setting data shown in FIG. 30, the characteristic of the filter whose center frequency was shifted to fo=120 Hz from the first filter identified by MOVE_NO=0 shown in FIG. 31 is shown in FIG. 34, and the synthetic characteristic is shown in FIG. 35.

Figure 35:
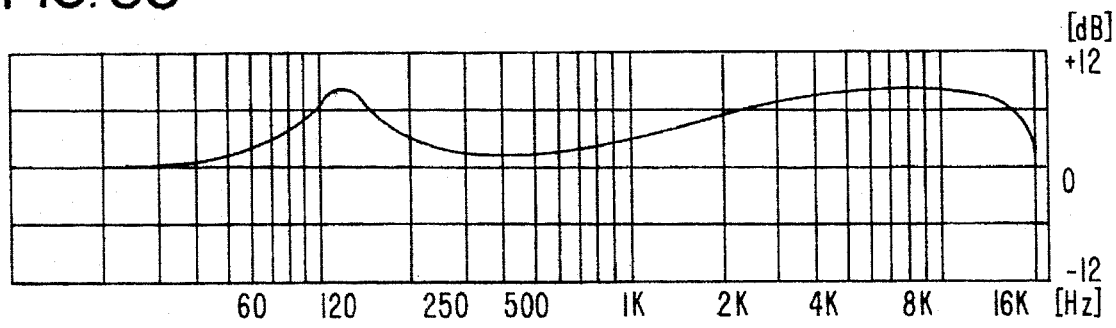
FIG. 35 shows the synthetic characteristic of the characteristic of the first filter with the shifted center frequency and a second filter.
Figure 36:
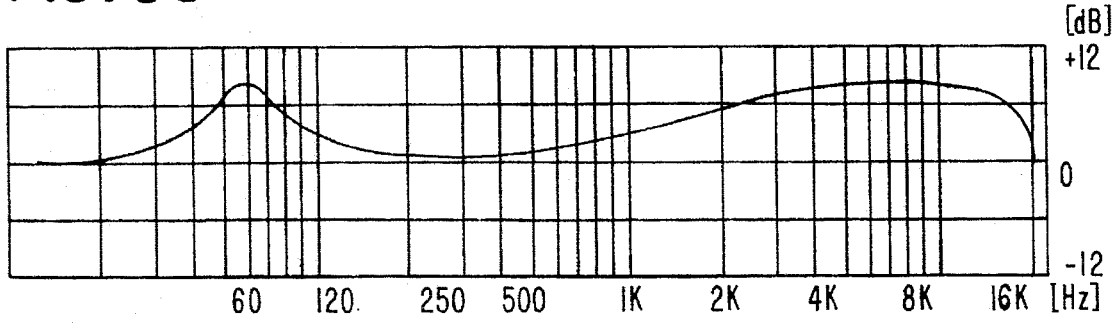
FIG. 36 shows the synthetic characteristic of the first set filter before the center frequency shift and the second set filter.

Next, the sum of the absolute errors is obtained from the synthetic characteristic shown in FIG. 35 and the desired setting characteristic (Step S20). In the example of the setting data shown in FIG. 30, the sum of absolute errors of the synthetic characteristic with the shifted fo becomes 25. It is then checked whether the sum of absolute errors after shifting to fo is smaller than before shifting (Step S21). If smaller, the content of the coefficient table is changed to the calculated coefficients of the filter MOVE_NO with the shifted fo (Step S22). If not smaller, the coefficients are again calculated from the previously saved fo, Q and GAIN of the filter MOVE_NO. Next, the characteristic of the shifted filter MOVE_NO and the synthetic characteristic are calculated (Step S22_a). In the example of the setting data shown in FIG. 30, the sum of absolute errors calculated at Step 10 is 15 and the sum of absolute errors calculated at Step S20 is 25. Therefore, the coefficients and characteristic are again calculated in accordance with fo=60 Hz, Q=1.75, and GAIN=8 dB before shifting. The synthetic characteristic with the initial fo is shown in FIG. 36.

Figure 37:
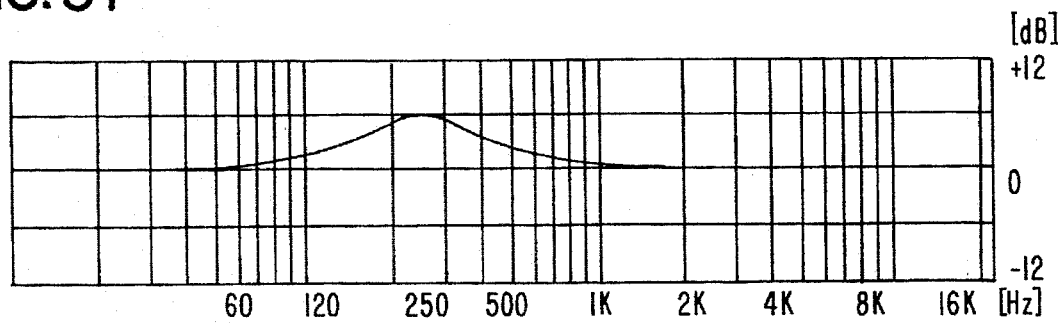
FIG. 37 shows the frequency characteristic of a third set filter according to a third embodiment.
Figure 38:
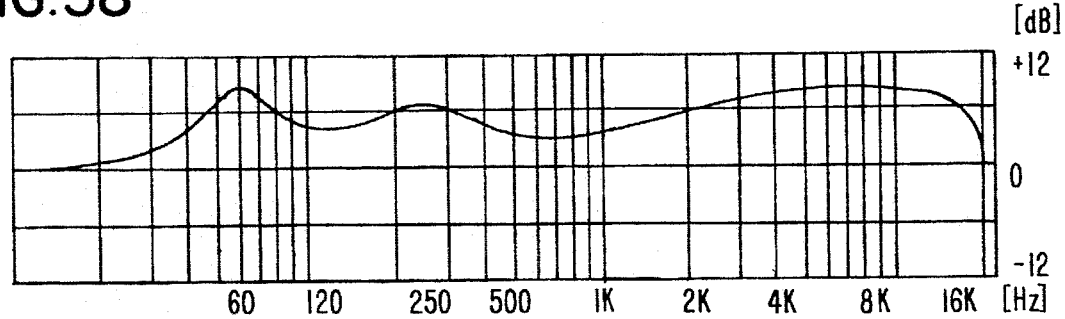
FIG. 38 shows the synthetic characteristic of the first to third set filters.

Next, BAND_NO is incremented (Step S23). The process sequence jumps to Step S5. In the example of the setting data shown in FIG. 30, BAND_NO is incremented to "2" to set the third filter and the process sequence jumps to Step S5. Since the approximations at 250 Hz, 500 Hz, and 1 kHz have not been completed as yet, Step S7 and following Steps are executed to set the third filter. Using the maximum value=6 dB, minimum value=0 dB, MAX_F=250 Hz, and MIN_F=60 Hz obtained at Step S10, the above-described process is executed to thereafter obtain fo=250 Hz, Q=0.82, and GAIN=6 dB as the parameters of the third filter. Then, Step S8 is executed to calculate the synthetic characteristic of the first to third filters. The characteristic of the first filter BAND_NO=2 is shown in FIG. 37, and the synthetic characteristic of the first to third filters is shown in FIG. 38.

After Step S9, the error calculating process is executed (Step S10). Since MOVE_NO remains HIGH_VALUE, the process sequence jumps to Step S23 whereat BAND_NO is incremented and thereafter it is checked whether the approximations at all setting frequency points have been completed. Next, in accordance with the coefficients in the coefficient table, the coefficients of the filters in the variable filter unit are changed (Step S6). In this manner, the filter setting calculating process is terminated.

Filter Determining Process (FIGS. 20 to 23).

The detail of the filter determining process at Step S2 will be described with reference to the flow charts of FIGS. 20 to 23. In the filter determining process, the center frequency fo, gain GAIN, and peak factor Q of the filter are determined using the gain at each given frequency point. In the filter determining process, it is checked whether one of the conditions that the absolute maximum value is smaller than the absolute minimum value and that both the maximum and minimum values are negative, is satisfied (Step S24). If not satisfied, the peaking filter is selected as the filter type, the center frequency (fo) is set to the frequency MAX_F taking the maximum value, and the gain (GAIN) is set to the maximum value (Step S26). On the other hand, if satisfied, the notch filter is selected, the center frequency (fo) is set to the frequency MIN_F taking the minimum value, and the attenuation is set to the minimum value (Step S25). In the example shown in FIG. 30, the maximum value is 8 dB, the minimum value is 2 dB, the peaking filter is selected, the center frequency is 60 Hz, and the gain is 8 dB.

Next, at Step S27, it is checked whether the frequency taking the maximum value is higher than the frequency taking the minimum value (MAX_F>MIN_F). If higher, the process sequence advances to the flow chart shown in FIG. 21 to check whether the peaking filter was selected (Step S28). If selected, it is checked whether BAND_NO of the filter is "0" (Step S29). If "0", it means that the first filter is to be set. A normal direction gain difference is set to the value obtained by subtracting from the maximum value the setting value (e.g., in the case of MAX_F=1 kHz, the setting data at 500 Hz) at the frequency one point lower than MAX_F, and a reversal direction gain difference is set to the value obtained by subtracting from the maximum value the setting value (e.g., in the case of MAX_F=1 kHz, the setting data at 2 kHz) at the frequency one point higher than MAX_F (Step S30). The normal direction is assumed to be the direction from MAX_F toward MIN_F. It is assumed herein that MAX_F>MIN_F, MAX_F is 1 kHz, and MIN_F is 500 Hz, and that the normal direction is the direction toward the frequency lower than MAX_F and the reversal direction is the direction toward the frequency higher than MAX_F. When BAND_NO is judged other than "0", i.e., when one or more filters have been estimated relative to the setting data, the normal direction gain difference is set to the value obtained by subtracting from the maximum value the absolute error at the setting frequency one point lower than MAX_F, and the reversal direction gain difference is set to the value obtained by subtracting from the maximum value the absolute error at the setting frequency one point higher than MAX_F (Step S31). Next, the provisional bandwidth is set to the difference value between the center frequency fo=MAX_F and the setting frequency one point lower than MAX_F (Step S32).

If the notch filter is selected at Step S28, it is checked whether BAND_NO is "0" (Step S33). If "0", the normal direction gain difference is set to the value obtained by subtracting from the minimum value the setting value at the frequency one point higher than MIN_F, and the reversal direction gain difference is set to the value obtained by subtracting from the minimum value the setting value at the frequency one point lower than MIN_F (Step S34). If BAND_NO is judged other than "0", the normal direction gain difference is set to the value obtained by subtracting from the minimum value the absolute error at the setting frequency one point higher than MIN_F, and the reversal direction gain difference is set to the value obtained by subtracting from the minimum value the absolute error at the setting frequency one point lower than MIN_F (Step S35). Next, the provisional bandwidth is set to the difference value between the center frequency fo=MIN_F and the setting frequency one point higher than MIN_F (Step S36).

Figure 20:
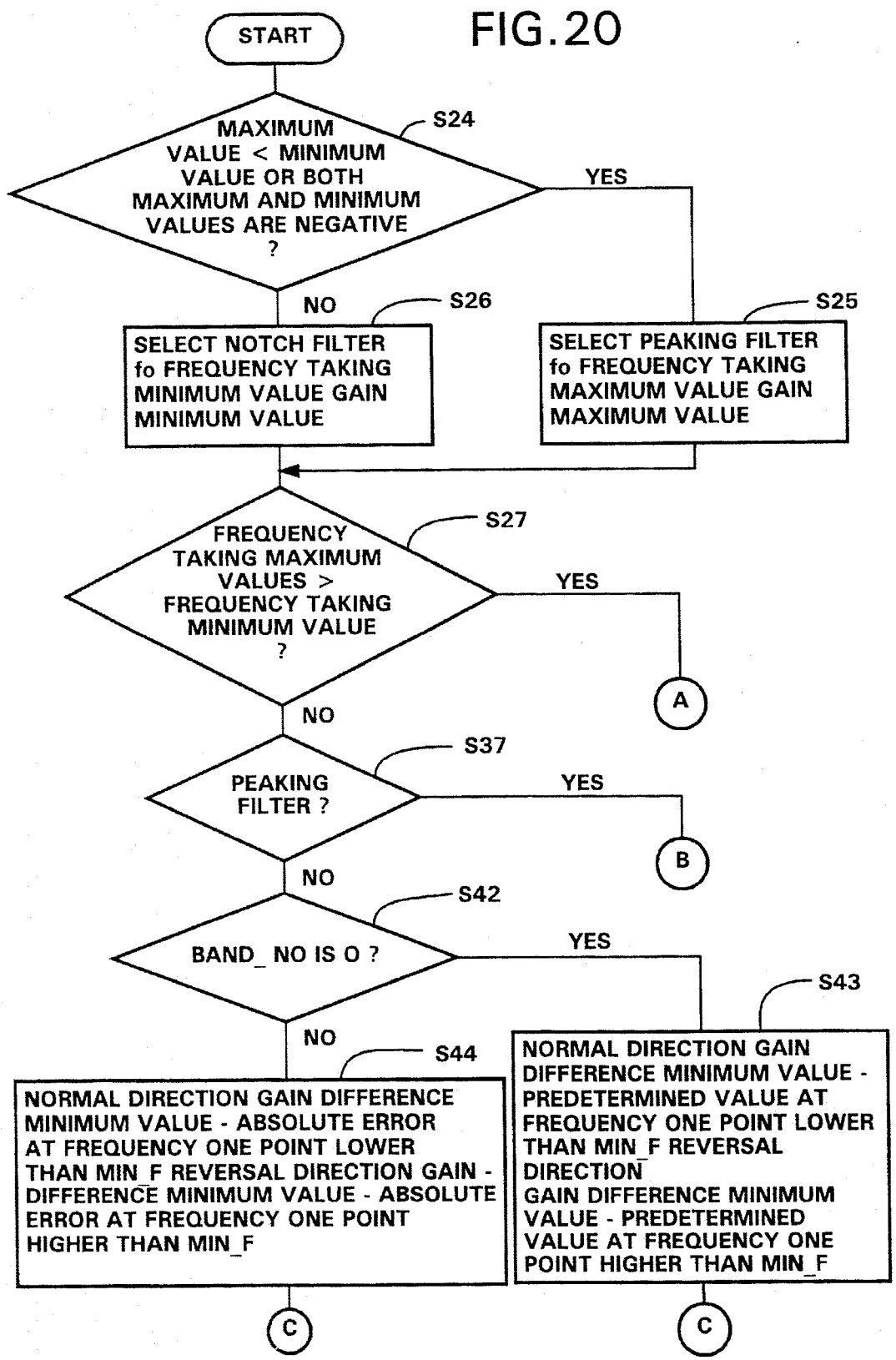
FIGS. 20–24 are detailed flow charts illustrating the filter determining process according to the second embodiment.
Figure 21:
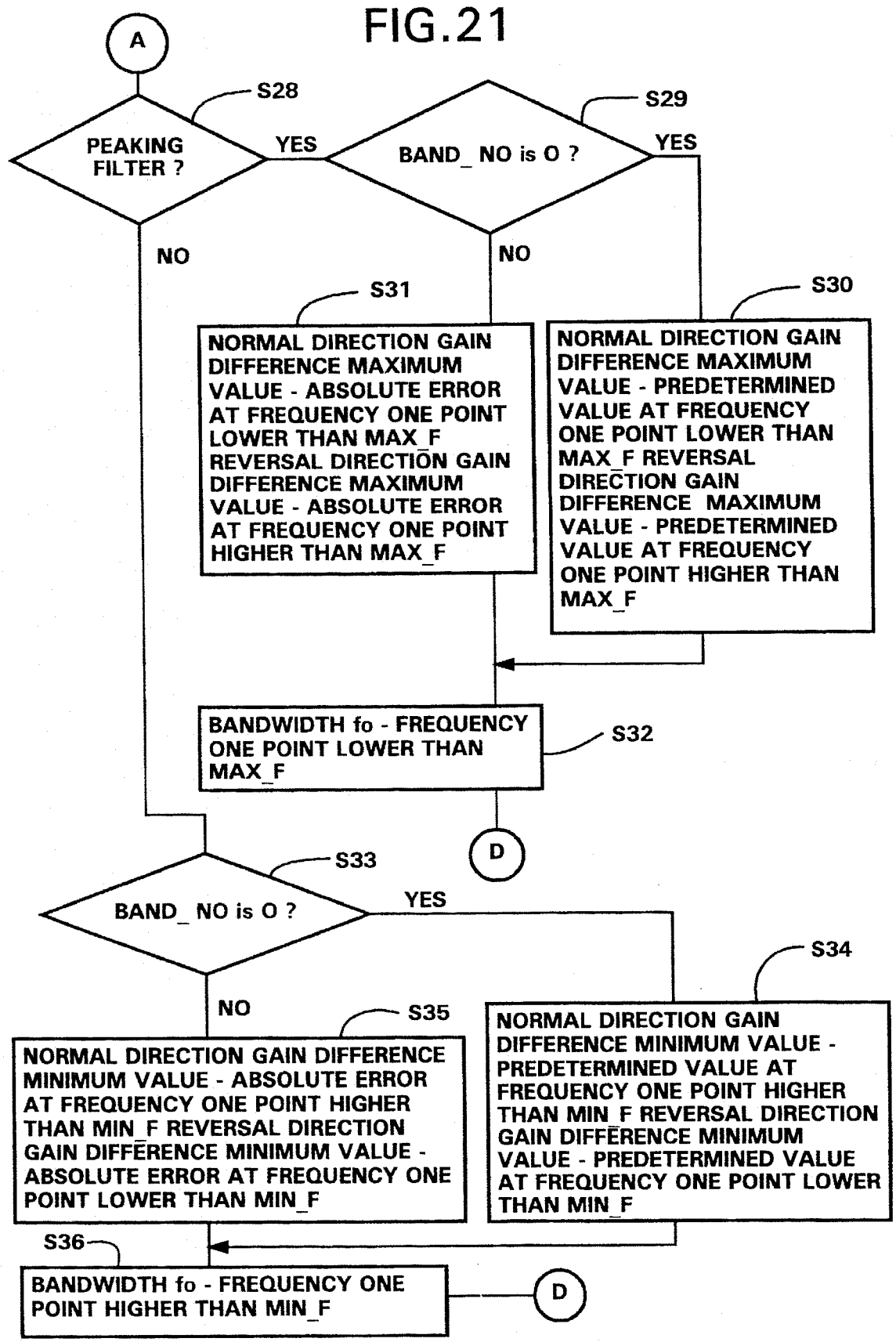
Figure 22:
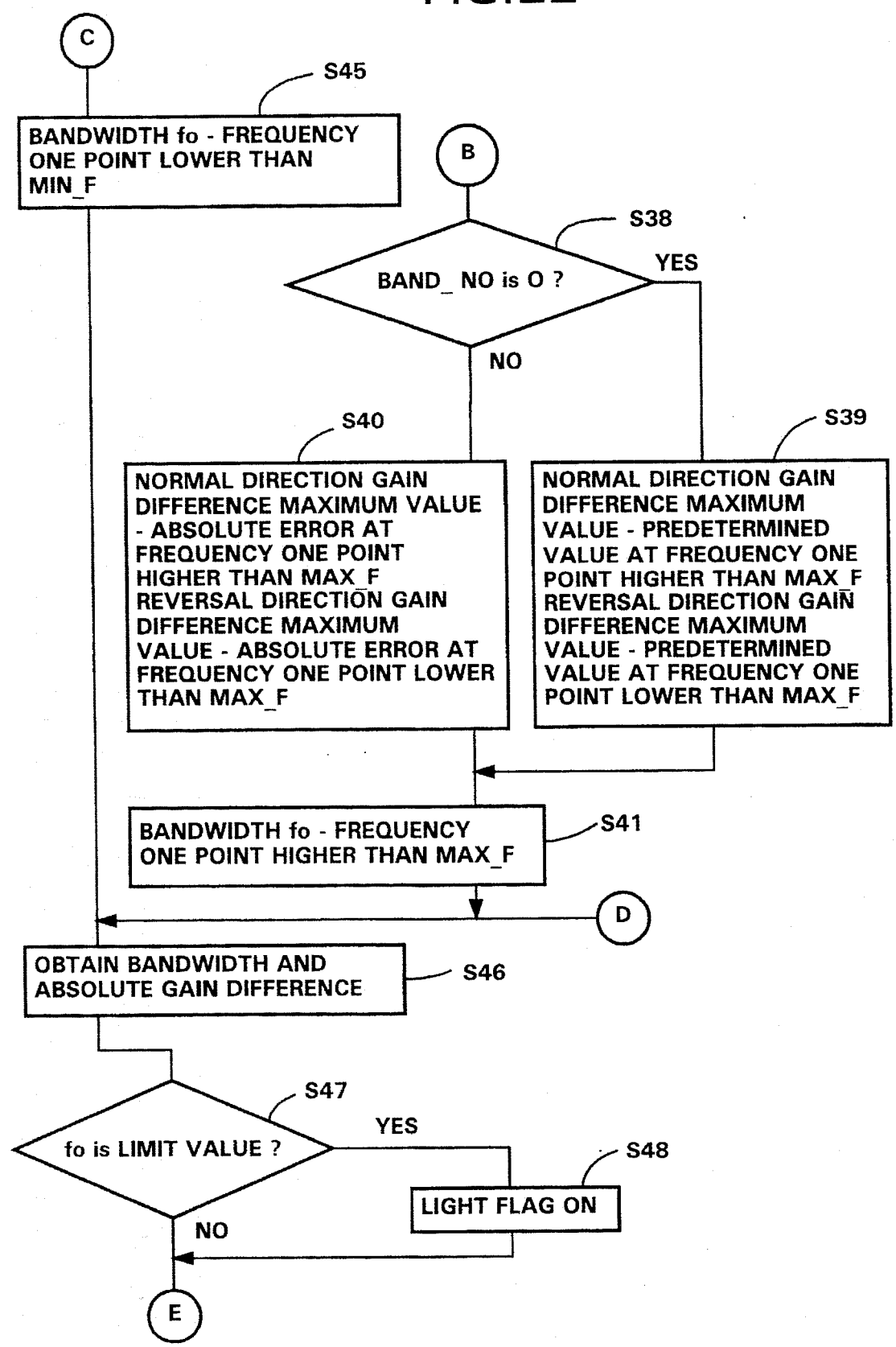

If the frequency taking the maximum value is judged at Step S27 smaller than the frequency taking the minimum value (MAX_F<MIN_F), it is then checked at Step S37 shown in FIG. 20 whether the peaking filter was selected. If the peaking filter was selected, the process sequence advances to the flow chart shown in FIG. 22 to check whether BAND_NO is "0" (Step S38). If "0", the normal direction gain difference is set to the value obtained by subtracting from the maximum value the setting value at the frequency one point higher than MAX_F, and the reversal direction gain difference is set to the value obtained by subtracting from the maximum value the setting value at the frequency one point lower than MAX_F (Step S39). If BAND_NO is judged other than "0", the normal direction gain difference is set to the value obtained by subtracting from the maximum value the absolute error at the setting frequency one point higher than MAX_F, and the reversal direction gain difference is set to the value obtained by subtracting from the maximum value the absolute error at the setting frequency one point lower than MAX_F (Step S40). Next, the provisional bandwidth is set to the difference value between the center frequency fo=MAX_F and the setting frequency one point higher than MAX_F (Step S41).

If it is judged at Step S37 that the notch filter was selected, it is checked whether BAND_NO is "0" (Step S42). If "0", the normal direction gain difference is set to the value obtained by subtracting from the minimum value the setting value at the frequency one point lower than MIN_F, and the reversal direction gain difference is set to the value obtained by subtracting from the minimum value the setting value at the frequency one point higher than MIN_F (Step S43). If BAND_NO is judged other than "0", the normal direction gain difference is set to the value obtained by subtracting from the minimum value the absolute error at the setting frequency one point higher than MIN_F, and the reversal direction gain difference is set to the value obtained by subtracting from the minimum value the absolute error at the setting frequency one point higher than MIN_F (Step S44). Next, the provisional bandwidth is set to the difference value between the center frequency fo=MIN_F and the setting frequency one point lower than MIN_F (Step S45).

Figure 23:
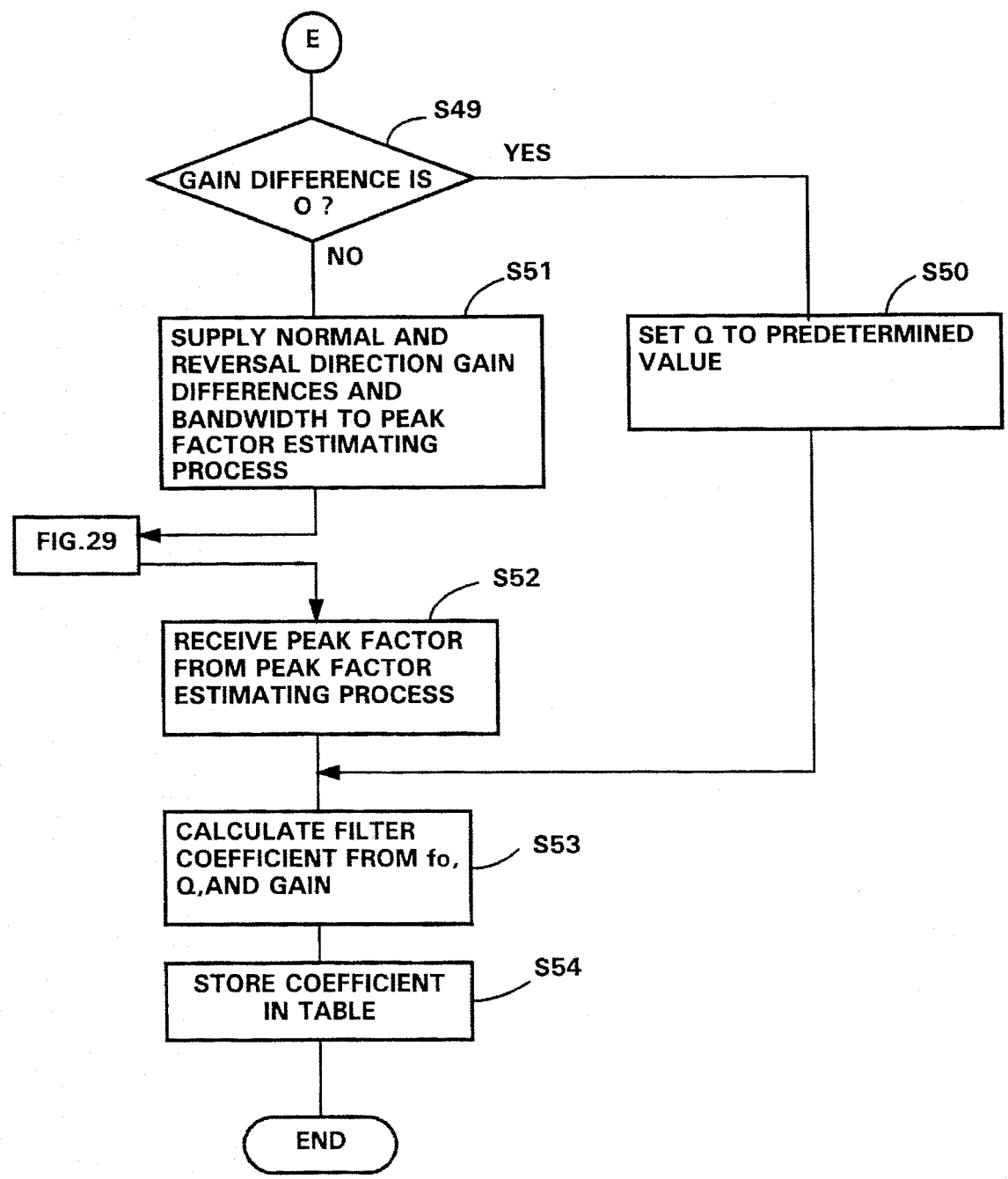

The absolute values of the normal and reversal direction gain differences and provisional bandwidth are obtained (Step S46) to determine the filter to be set. It is first checked whether the center frequency fo is a setting limit value (e.g., 60 Hz or 16 kHz at the opposite ends of the setting frequency points shown in FIG. 30). If it is judged as the setting limit value, a limit FLAG indicating such a state is turned on (Step S48). Next, it is checked if the normal direction gain difference is "0" (Step S49). If "0", the normal and reversal gain differences and bandwidth are passed to the peak factor estimating flow (FIG. 29) (Step S51). In the peak factor estimating flow, in accordance with the received normal and reversal gain differences and provisional bandwidth, the value of Q is estimated through the fuzzy estimation and passed to the filter determining process (FIG. 23). The fuzzy estimation in this case will be described later. In the filter determining process, the value of Q is received (Step S52). Next, the filter weight coefficients are calculated from fo, Q, and GAIN (Step S53). The weight coefficients are stored in the coefficient table (Step S54) to thereafter terminate the filter determining process.

The peak factors of the filters estimated by the filter determining process for the setting data shown in FIG. 30 are as follows.

For the filter BAND_NO=0 with the maximum value=8, minimum value=2, MAX_F=60 Hz, and MIN_F=120 Hz, the peaking filter type is selected with the 20 settings of fo=60 Hz and GAIN=8 dB. Calculated are the normal direction gain difference=6 dB, reversal direction gain difference=0 dB, and provisional bandwidth=60 Hz with the limit FLAG being turned on. Therefore, Q is estimated as 1.75.

For the filter BAND_NO=1 with the maximum value=8, minimum value=8, MAX_F=8 kHz, and MIN_F=8 kHz, the peaking filter type is selected with the settings of fo=8 kHz and GAIN=8 dB. Calculated are the normal direction gain difference=0 dB, reversal direction gain difference=0 dB, and provisional bandwidth=4 kHz with the limit FLAG being turned off. Therefore, Q is estimated as 0.5.

For the filter BAND_NO=2 with the maximum value=6 dB, minimum value=0 dB, MAX_F=250 Hz, and MIN_F=60 Hz, the peaking filter type is selected with the settings of fo=250 Hz and GAIN=6 dB. Calculated are the normal direction gain difference=5 dB, reversal direction gain difference=2 dB, and provisional bandwidth=130 Hz with the limit FLAG being turned off. Therefore, Q is estimated as 0.82.

Error Calculating Process (FIGS. 24 to 26)

The error calculating process at Steps S4 and S10 is in detail to execute the processes illustrated in FIGS. 24 to 26. Referring to FIG. 24, the setting frequency range is divided into bands each defined by three setting frequency points, to evaluate each band (Step S55). For the evaluation of each band, the process of obtaining the following values is executed (Step S56). The values to be obtained include the absolute error given by the equation (1), a sum of absolute values, the converted setting value and approximate value given by the equation (2), the relative error given by the equation (3), a sum of relative errors of each band, the maximum absolute and relative error values, the minimum absolute and relative error values, the frequency taking the maximum relative error, and the frequency taking the minimum relative error.

It is then checked whether the setting values are within the range from −6 dB to +6 dB (Step S58). If within this range, it is checked whether the relative error is 0.08 or smaller at the setting frequency point (Step S59). If 0.08 or smaller, the approximation at this setting frequency point is terminated (Step S60). If it is judged that the relative error is outside of the range from −6 dB to +6 dB, it means that the setting value is large. Accordingly, it is judged whether the relative error at the setting point is relatively large 0.15 or smaller (Step S61). If 0.15 or smaller, the approximation at this setting frequency point is terminated (Step S62).

Next, referring to FIG. 25, the band having the maximum relative error is obtained (Step S63). CHK_END is turned off (Step S64). It is checked whether all the bands have been checked or CHK_END is on (Step S65). If neither of the conditions is satisfied, the following processes are performed starting from the band having a larger sum of relative errors. It is checked whether the maximum relative error is within the range from 0.16 to 0.39 (Step S66). If within this range, it is checked whether there is a filter having the center frequency fo within the band (Step S67). If there is such a filter, MOVE_NO at the control unit is set to the number of the band now in check, the center frequency is shifted in the manner described later, and CHK_END is turned on (Step S68). If there is no filter having the center frequency fo within the range or if the relative error is outside of the range from 0.16 to 0.39, the band having the next largest error is checked (Step S68).

Next, at Step S70 shown in FIG. 26, using the values at the band having the largest sum of relative errors, the maximum value is set to the maximum absolute error, the minimum value is set to the minimum absolute value, the frequency taking the maximum value is set to the frequency taking the maximum relative error, and the frequency taking the minimum value is set to the frequency taking the minimum relative error. After preparing for setting the next filter, the error calculating process (Step S4 in FIG. 17) is terminated.

The contents of the error calculating process for the example of the setting data shown in FIG. 30 are as follows. In this case, the setting frequency characteristic range is divided into the low band of 60 Hz, 120 Hz, and 250 Hz, the middle band of 500 Hz, 1 kHz, and 2 kHz, and the high band of 4 kHz, 8 kHz, and 16 kHz.

For the second filter BAND_NO=0, the sum of absolute errors is 44. In the low band, the sum of relative errors= 0.382, the maximum relative error=0.316, the maximum absolute error=6 dB, the minimum relative error=0.0, the minimum absolute error=0 dB, the frequency taking the maximum relative error=350 Hz, and the frequency taking the minimum relative error =60 Hz. In the middle band, the sum of relative errors =0.706, the maximum relative error= 0.235, the maximum absolute error=4 dB, the minimum relative error=0.235, the minimum absolute error=4 dB, the frequency taking the maximum relative error=500 Hz, and the frequency taking the minimum relative error=500 Hz. In the high band, the sum of relative errors=1.143, the maximum relative error=0.381, the maximum absolute error=8 dB, the minimum relative error=0.381, the minimum absolute error=8 dB, the frequency taking the maximum relative error=8 kHz, and the frequency taking the minimum relative error=8 kHz. From these data, the high band has the maximum sum of relative errors, with the maximum value=8 dB, minimum value=8 dB, MAX_F=8 kHz, and MIN_F=8 kHz. Namely, the second filter to be next set is corrected relative to the high band.

For the first filter BAND_NO=1, the sum of absolute errors is 16. In the low band, the sum of relative errors= 0.382, the maximum relative error=0.316, the minimum relative error=0.0, the minimum absolute error=0 dB, the frequency taking the maximum relative error=250 Hz, and the frequency taking the minimum relative error=60 Hz. In the middle band, the sum of relative errors=0.106, the maximum relative error=0.235, the maximum absolute error=4 dB, the minimum relative error=0.235, the minimum absolute error=4 dB, the frequency taking the maximum relative error=500 Hz, and the frequency taking the minimum relative error=500 Hz. In the high band, the sum of relative errors=0.190, the maximum relative error=0.095, the maximum absolute error=2 dB, the minimum relative error=0.048, the minimum absolute error=1 dB, the frequency taking the maximum relative error=16 kHz, and the frequency taking the minimum relative error =8 kHz. From these data, the middle band has the maximum sum of relative errors, with the maximum value=6 dB, minimum value=0 dB, MAX_F=250 Hz, and MIN_F= 60 Hz. Namely, the third filter to be next set is corrected relative to the middle band.

For the third filter BAND_NO=2, the sum of absolute errors is 10. In the low band, the sum of relative errors= 0.100, the maximum relative error=0.052, the maximum absolute error=1, the minimum relative error=0.0, the minimum absolute error=0, the frequency taking the maximum relative error=120 Hz, and the frequency taking the minimum relative error =60 Hz. In the middle band, the sum of relative errors =0.165, the maximum relative error=0.059, the maximum absolute error=1, the minimum relative error= 0.053, the minimum absolute error=−1, the frequency taking the maximum relative error=250 Hz, and the frequency taking the minimum relative error=500 Hz. In the high band, the sum of relative errors=0.190, the maximum relative error= 0.095, the maximum absolute error=1, the minimum relative error=0.048, the minimum absolute error=2, the frequency taking the maximum relative error=4 kHz, and the frequency taking the minimum relative error=16 kHz. After setting the filter BAND_NO =2, the approximation at all setting frequency points falls within the predetermined allowable range, and the filter setting is terminated.

Figure 28:
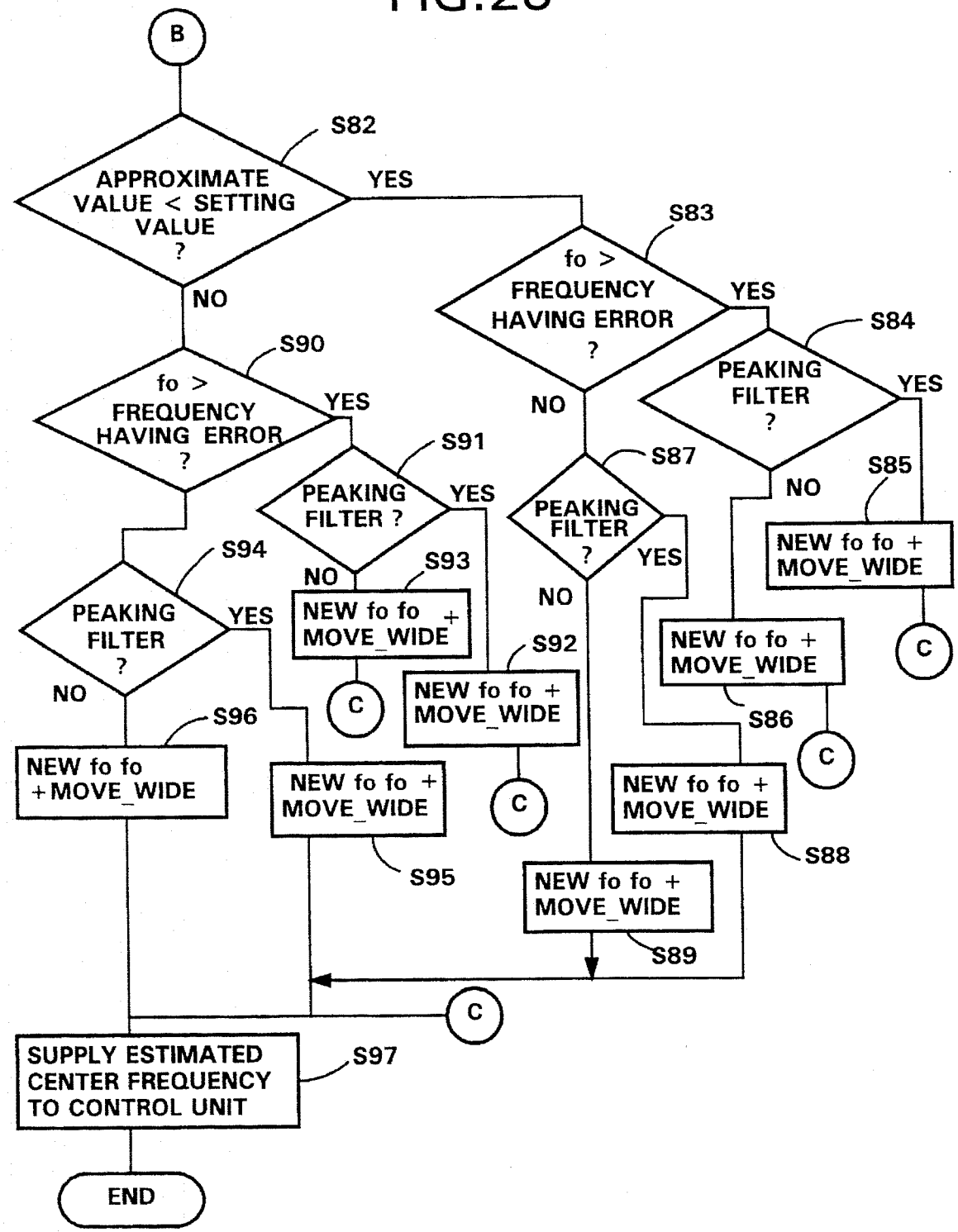

Center Frequency Estimating Process (FIGS. 27 and 28)

In the center frequency estimating process, the center frequency is shifted. After receiving the frequency f* having the maximum error and the center frequency fo obtained at Step S16 of the main flow of the controlling process, the center frequency estimating process starts. First, which center frequency is shifted to what amount is determined from the properties of the setting data and errors. Referring to FIG. 27, it is first checked whether the setting values are within the range from −6 dB to +6 dB (Step S71). If within this range, it is checked whether the relative error at the frequency f* is 0.1 or smaller (Step S72). If 0.1 or smaller, MOVE_WIDE representing the shift amount of the center frequency is set to the value of 1/30 CT which is the interval between the setting frequency points (Step S73). If larger than 0.1, it is then checked whether the relative error is 0.15 or larger (Step S74). If 0.15 or larger, MOVE_WIDE is set to 10 CT (Step S75). If smaller, MOVE_WIDE is set to 2/30 CT (Step S76). If it is judged that the setting values are not within the range from −6 dB to +6 dB, it is checked whether the relative error is 0.2 or smaller (Step S77). If 0.2 or smaller, MOVE_WIDE is set to 1/30 CT (Step S78). If larger, it is then checked whether the relative value is 0.25 or larger (Step S79). If 0.25 or larger, MOVE_WIDE is set to 10 CT (Step S80). If smaller, MOVE_WIDE is set to 2/30 CT (Step S81).

Referring to FIG. 28, to determine the shift direction, it is first checked whether the approximate value is smaller than the setting value (Step S82). If smaller, it is checked whether the center frequency fo is higher than the frequency f* having the maximum error (Step S83). If higher, it is checked whether the filter is the peaking filter (Step S84). If it is the peaking filter, the new fo is set to the value obtained by subtracting MOVE_WIDE from the initial fo (Step S85). If the filter is judged as the notch filter, the new fo is set to the value obtained by adding MOVE_WIDE to the initial fo (Step S86). If the center frequency fo is judged lower than f*, it is then checked whether the filter is the peaking filter (Step S87). If it is the peaking filter, the new fo is set to the value obtained by adding MOVE_WIDE to the initial fo (Step S88). If it is judged as the notch filter, the new fo is set to the value obtained by subtracting MOVE_WIDE from the initial fo (Step S89).

If it is judged that the approximate value is larger than the setting value, it is then checked whether the center frequency fo is higher than the frequency f* having the error (Step S90) (Step S90). If higher, it is then checked whether the filter is the peaking filter (Step S91). If it is the peaking filter, the new fo is set to the value obtained by adding MOVE_WIDE to the initial fo (Step S92). If it is judged that the filter is the notch filter, the new fo is set to the value obtained by subtracting MOVE_WIDE from the initial fo (Step S93). If it is judged that the center frequency fo is lower, it is then checked whether the filter is the peaking filter (Step S94). If it is the peaking filter, the new fo is set to the value obtained by adding MOVE_WIDE to the initial fo (Step S96).

In this manner, after estimating the new fo, this new fo is passed to the control process (Step S97) to terminate the center frequency estimating process.

For the example of the setting data shown in FIG. 30, this estimating process is executed only for the filter MOVE_ NO=0, obtaining fo=60 Hz, the frequency f* having the maximum error=250 Hz, the setting value =6 dB, the approximate value=0 dB, and the relative error=0.316. Since the selected filter type is the peaking filter, the new fo is fo+1 OCT=120 Hz.

Figure 29:
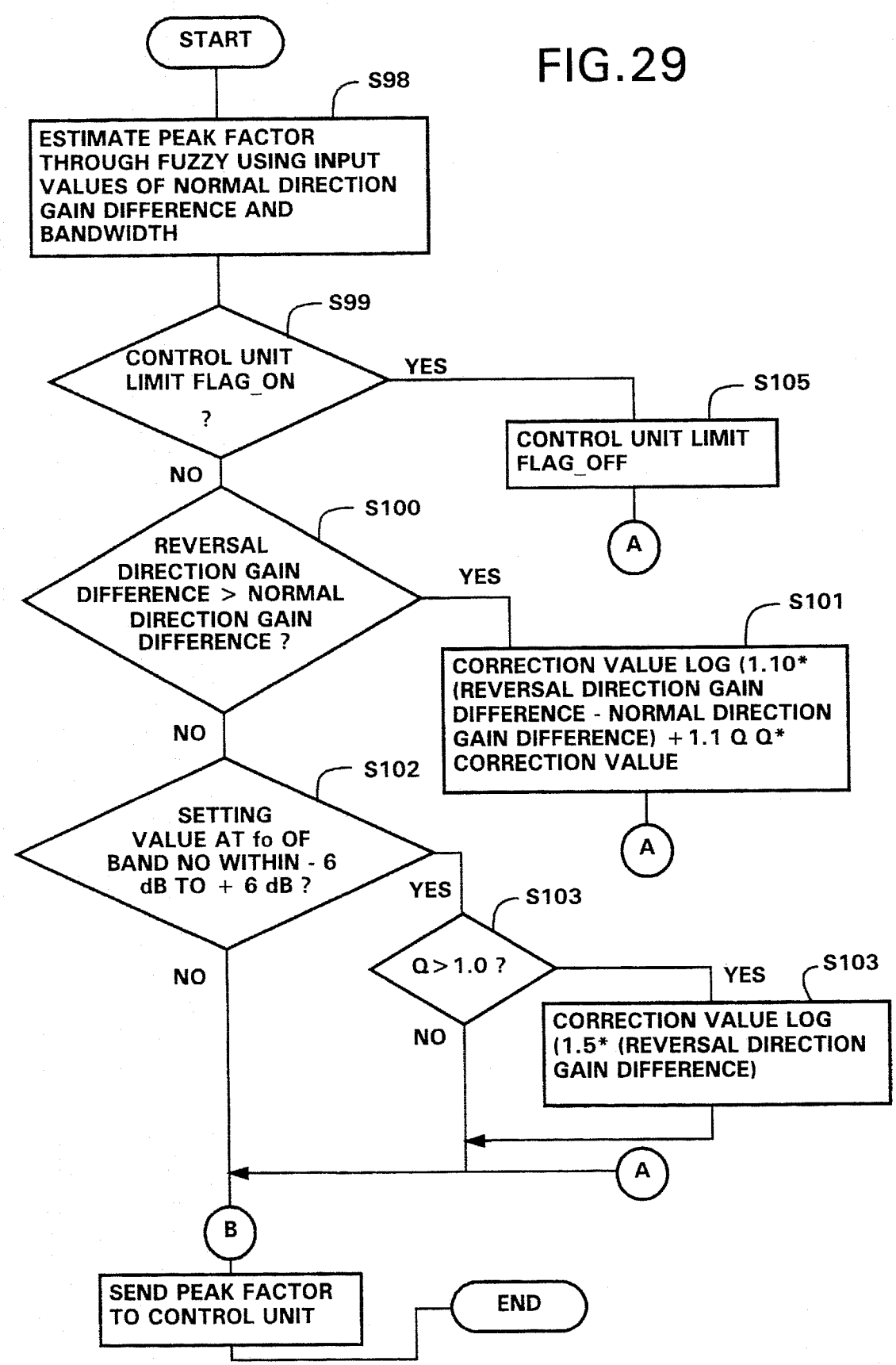
FIG. 29 is a flow chart illustrating a peak factor estimating process according to the second embodiment.

Peak Factor estimating Process (FIG. 29)

In the peak factor estimating process in the filter determining process, the peak factor Q is estimated through the fuzzy estimation to be described later, by using as the input values the normal and reversal direction gain differences and provisional bandwidth obtained at Step S51 in the filter determining process (Step S98). It is checked whether the limit FLAG is on (Step S99). If not on, it is then checked whether the reversal direction gain difference is larger than the normal direction gain difference (Step S100). If larger, it is necessary to correct the estimated Q so that the correction value is set to the value of log (1.9 * |reversal direction gain difference−normal direction gain difference|)+1.1, and the estimated Q is multiplied by the correction value to obtain the final Q (Step S101). If it is judged smaller at Step S100, it is then checked whether the setting value at fo of the filter BAND_NO is within the range from −6 dB to +6 dB (Step S102). If within this range, it is checked if Q is 1.0 or higher (Step S103). If higher, it is also necessary to correct the estimated Q so that the correction value is set to the value of log (1.5 * |reversal direction gain difference|), and the estimated Q is multiplied by the correction value to obtain the final Q (Step S104). If the limit FLAG is on at Step S105, the limit FLAG is turned off (Step S105). The estimated Q is passed to the control unit (Step S106) to terminate the peak factor estimating process.

In the example shown in FIG. 30, the contents of the above process are as follows. For the filter BAND_NO=0, there are obtained the normal direction gain difference=6 dB, the reversal direction gain difference=0 dB, and the provisional bandwidth=60 Hz, resulting in the Q value of 1.75. Since the limit FLAG is on, it is turned off and the value Q is passed to the filter determining process.

For the filter BAND_NO=2, there are obtained the normal direction gain difference=5 dB, the reversal direction gain difference=0 dB, and the provisional bandwidth=130 Hz, resulting in the Q value of 0.82. Since the normal direction gain difference is larger than the reversal direction gain difference, the value Q is passed to the filter determining process without any correction.

Obtaining Peak Factor (Q) through Fuzzy Estimation

The fuzzy rules of the fuzzy estimation method are shown in Table 1, for the case where the peak factor of the filter is estimated using as the input values the center frequency and provisional bandwidth or frequency width obtained at Step S118 shown in FIG. 6 of the first embodiment.

TABLE 1

Fuzzy rules for the estimation of Q

| Frequency width | Center frequency (fo) | | | | | | | |
|---|---|---|---|---|---|---|---|---|
| (FRQ_WIDE) | VL | L | ML | MM | M | MH | H | VH |
| VN | M | MH | | | | | | |
| N | | MH | H | | | | | |
| MN | | MM | M | MH | | | | |
| MM | | | L | MM | MH | | | |
| M | | L | M | MH | MH | | | |
| MW | | | L | MM | M | MH | | |
| W | | | | M | M | M | MH | H |
| VW | | | | M | M | M | M | MH |

The meanings of the symbols of the fuzzy sets representing Q in Table 1 are:

| VL (Very Low) | very low |
|---|---|
| L (Low) | low |
| MM (More or Less Medium) | more or less medium |
| M (Medium) | medium |
| H (High) | high |
| VH (Very High) | very high |

The meanings of the symbols of the fuzzy sets representing frequency width are:

| VN (Very Narrow) | very narrow |
|---|---|
| N (Narrow) | narrow |
| MN (More or Less Narrow) | more or less narrow |
| MM (More or Less Medium) | more or less medium |
| M (Medium) | medium |
| MW (More or Less Wide) | more or less wide |
| W (Wide) | wide |
| VW (Very Wide) | very wide |

The meanings of the symbols of the fuzzy sets representing center frequencies are:

| VL (Very Low) | very low |
|---|---|
| L (Low) | low |
| ML (More or Less Low) | more or less low |
| MM (More or Less Medium) | more or less medium |
| M (Medium) | medium |
| MH (More or Less High) | more or less high |
| H (High) | high |
| VH (Very High) | very high |

Examples of statements of some rules shown in Table 1 are given below.

(Example 1) If FRQ_WIDE is Very Narrow and fo is Very Low, then Q is Medium.

(Example 2) If FRQ_WIDE is Very Narrow and fo is Low, then Q is More or less High.

Using the fuzzy rules, the value Q is estimated.

The fuzzy rules of the fuzzy estimation method are shown in Table 2, for the case where the peak factor of the filter is estimated using as the input values the normal direction gain difference and provisional bandwidth or frequency width obtained at Step S98 of FIG. 29 of the second embodiment.

TABLE 2

Fuzzy rules for the estimation of Q

Normal Direction

TABLE 2-continued

| GAin Difference | Frequency width (FRQ_WIDE) | | | |
|---|---|---|---|---|
| (POSI_AMP_WIDE) | N | M | W | VW |
| S | L*)[1] | ML | ML | VL |
| L | H*)[2] | VH | H | M |

The meanings of the symbols of the fuzzy sets representing Q in Table are:

| VL (Very Low) | very low |
|---|---|
| L (Low) | low |
| ML (More or Less Low) | more or less low |
| M (Medium) | medium |
| H (High) | high |
| VH (Very High) | very high |

The meanings of the symbols of the fuzzy sets representing frequency width are:

| | |
|---|---|
| N (Narrow) | narrow |
| M (Medium) | medium |
| W (Wide) | wide |
| VW (Very Wide) | very wide |

The meanings of the symbols of the fuzzy sets representing normal direction gain differences are:

| | |
|---|---|
| S (Small) | small |
| L (Large) | large |

Examples of statements of some rules shown in Table 2 are given below.

(Example 1) If FRQ_WIDE is Narrow and POSI_AMP_WIDE is Small, then Q is Low.

(Example 2) If FRQ_WIDE is Narrow and POSI_AMP_WIDE is Large, then Q is High.

Figure 39:
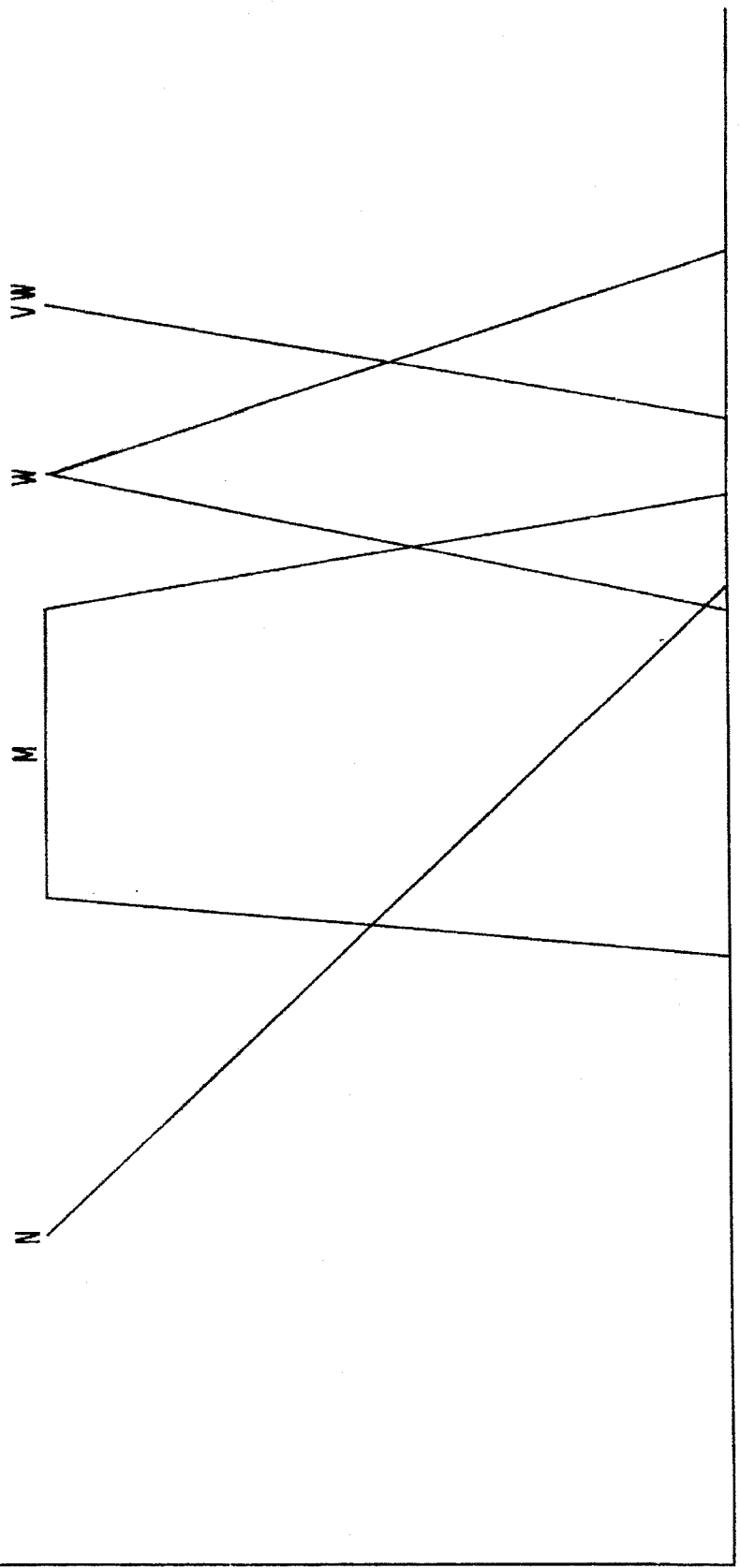
FIGS. 39 to 41 show fuzzy sets of the fuzzy estimation.

The grade values of the frequency width (FRQ_WIDE) and normal direction gain difference (AMP_WIDE) are obtained from the fuzzy sets of the frequency width shown in FIG. 39 and the fuzzy sets of the normal direction gain difference. Using the fuzzy rules, the value Q is estimated.

Examples of Filter Structure

Figure 40:
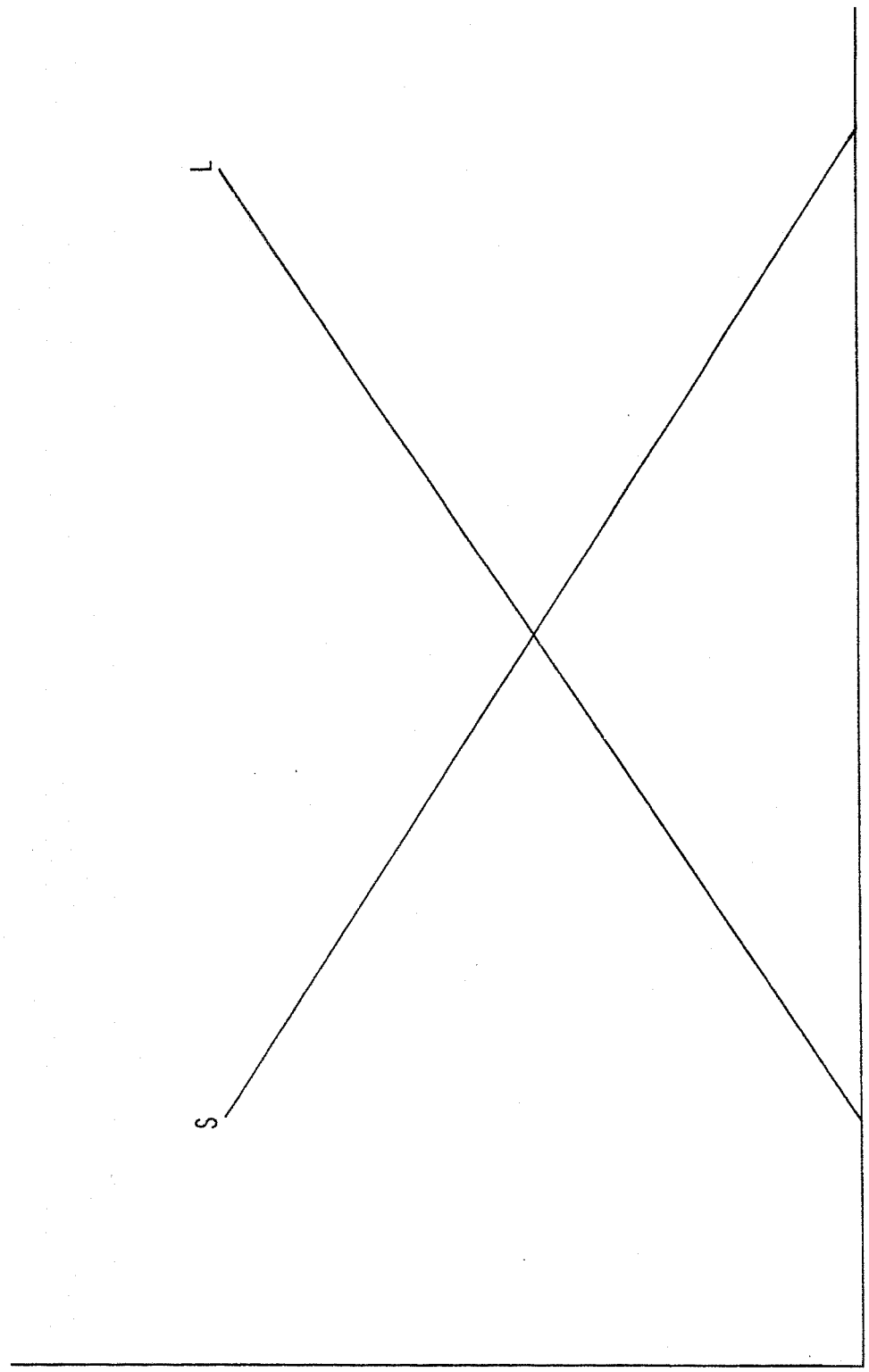
Figure 41:
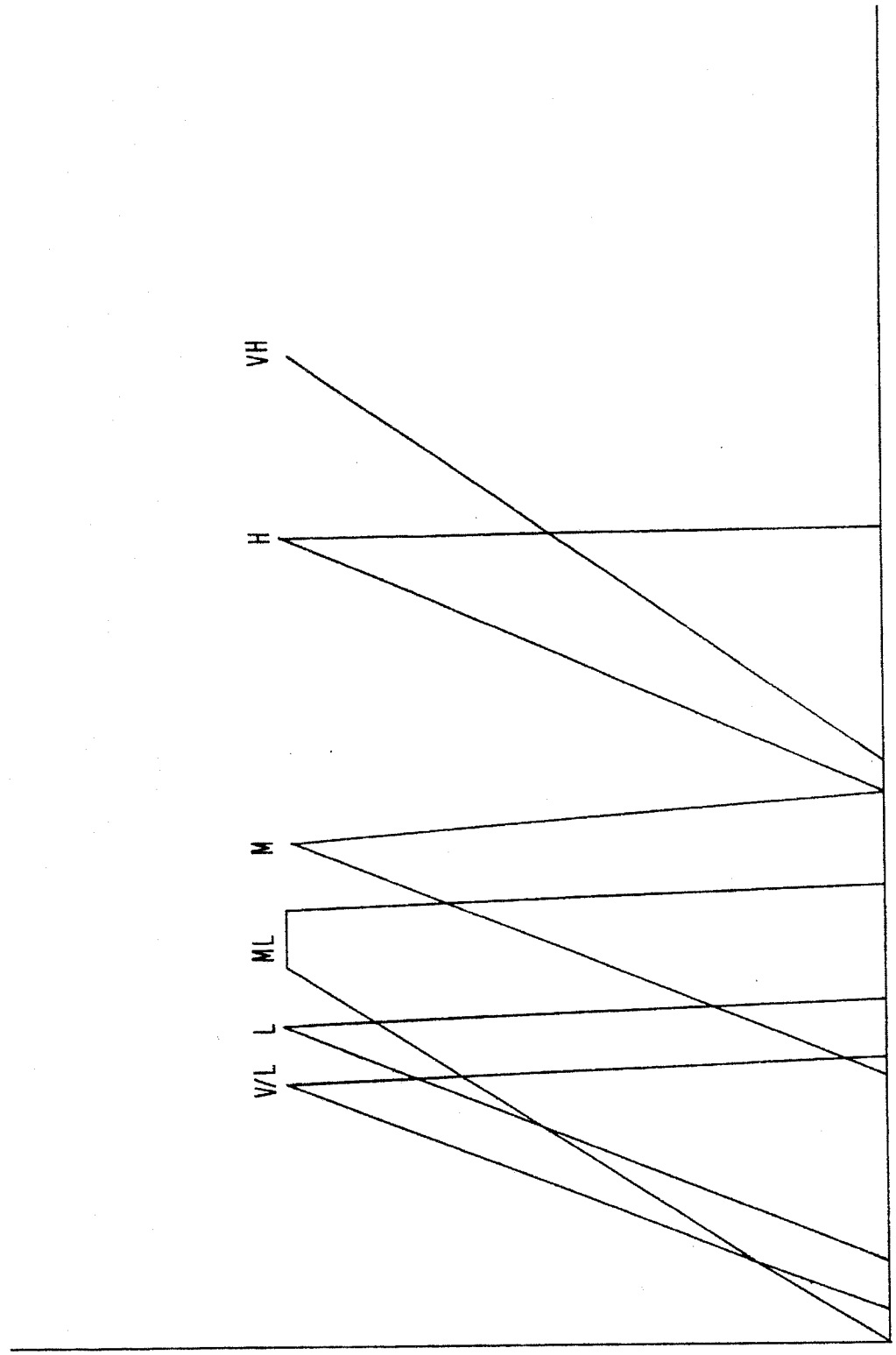
Figure 42:
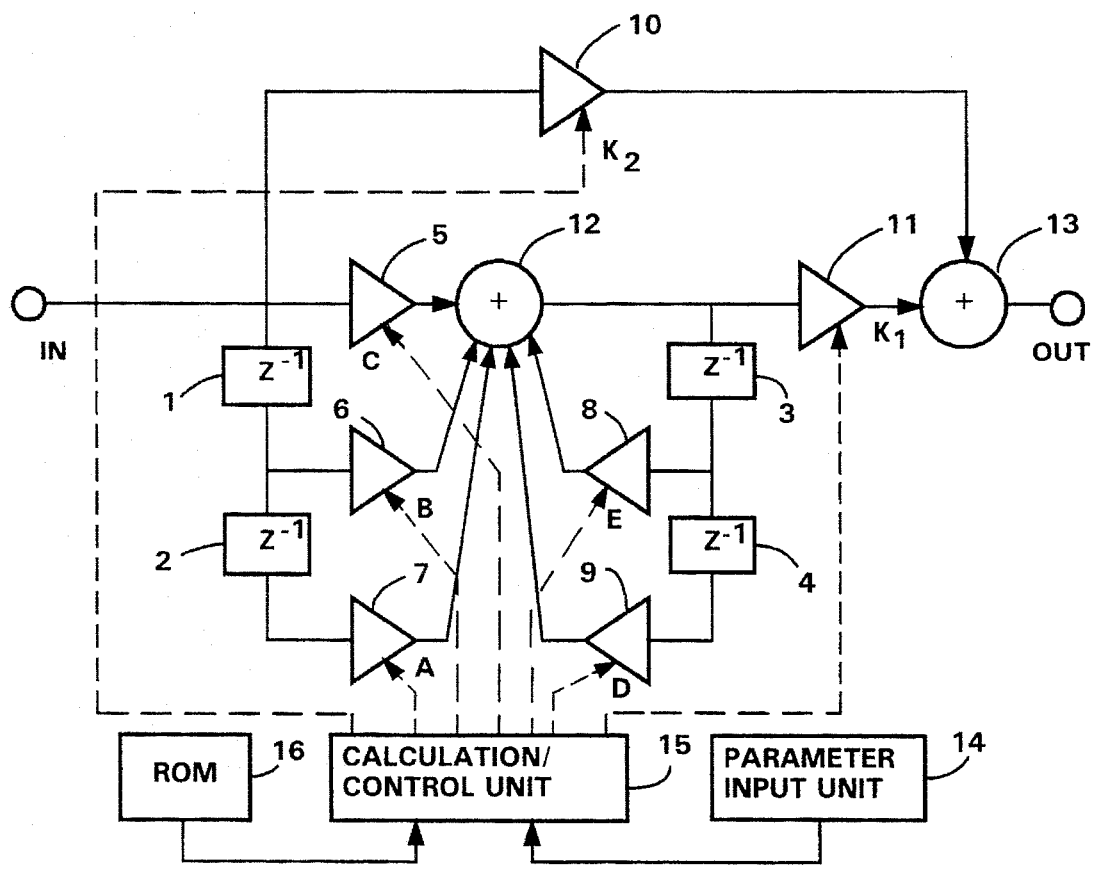
FIG. 42 shows the characteristic synthesis of a digital filter used by the present invention.

The structure of a digital filter suitable for the equalizer of the present invention is shown in FIG. 42. In FIG. 42, reference numerals 1 to 4 represent a sampling time interval delay element, reference numerals 5 to 11 represent a weight multiplier for coefficients A to E and $K_1$ and $K_2$, reference numerals 12 and 13 represent an adder, reference numeral 14 represents a unit for inputting parameters including a desired center frequency and filter gain, and reference numeral 16 represents a ROM for storing the filter weight coefficients A to E. Reference numeral 15 represents an unit for reading a suitable weight coefficient from ROM in response to the inputted center frequency and gain, and calculating the filter correction coefficients $K_1$ and $K_2$ to control the filter. These elements may be configured using either software or hardware. The transfer function of the filter is given by the following equations.

$$H(Z)=(AZ^{-2}+BZ^{-1}+C)/(BZ^{-2}+EZ^{-1}+1) \; K_1+K_2$$

$$K_1=(1-10^{\beta/20})/(1-10^{\alpha/20})$$

$$K_2=1-K_1$$

where $\alpha$ represents a reference gain value, and $\beta$ represents an inputted desired gain value. Consider for example a reference filter (i.e., $K_1=K_2=1.0$) having the center frequency of 1 KHz, the peak factor Q of 1.0, and the gain $\alpha$ of 12 dB. The weight coefficients A to E of the reference filter read from ROM are given below, and the frequency characteristic is shown in FIG. 40.

| A | B | C | D | E |
|---|---|---|---|---|
| 0.68852 | −1.85594 | 1.18642 | 0.87493 | −1.85594 |

The values $K_1$ and $K_2$ for changing the gain $\beta$ of the reference filter to 10 dB are given by:

$$K_1=(1-10^{10/20})/(1-10^{12/20})=0.72533$$

$$K_2=1-K_1=0.27467$$

Figure 43:
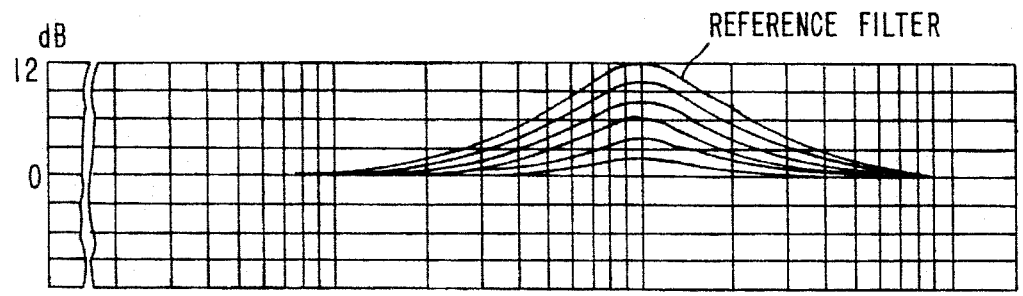
FIG. 43 shows the characteristics of the digital filter shown in FIG. 42.

FIG. 43 shows the frequency characteristic of the filter having the weight coefficients A to E and the values $K_1$ and $K_2$ obtained for $\beta$=10, 8, 6, 4, and 2 dB. A desired characteristic of the filter can be calculated from a set of the filter weight coefficients A to E stored in ROM and the values $K_1$ and $K_2$ calculated from the inputted gain value $\beta$. Even if the number of filter weight coefficients becomes large, it is sufficient only to calculate the two coefficients $K_1$ and $K_2$, allowing to set a filter at high speed.

In the structure shown in FIG. 42, the multipliers 10 and 11 and the adder 13 may be omitted to transform the filter to a general double second order transfer function. In this case, in obtaining the values $K_1$ and $K_2$, the weight coefficients used are $A'=A*K_1+D*K_2$, $B'=B$, $C'=C*K_1+K_2$, $D'=D$, and $E'=E$.

What is claimed is:

1. Sound field frequency characteristic compensation apparatus comprising an input unit (1) for entering object data of gain values respectively at a plurality of predetermined frequency points in a sound field frequency band, the gain values specifying an object frequency characteristics for compensation, a processing unit (2) for determining parameters which define filters to be set according to the object data of gain values entered by said input unit, and a variable filter unit (4) for setting filters on the basis of the determined parameters to approximate the object frequency characteristics with synthesized frequency characteristics of the set filters, wherein (1) said processing unit determines a first filter of peaking type or notch type which has a center frequency equal to the frequency point associated with the maximum or minimum gain value in the object data, and gain and peak factor estimated according to the object date of gain values, (2) said processing unit obtains error values between the frequency characteristics of the determined first filter and the object frequency characteristics at the frequency points in each of sub-bands which are assigned by dividing the sound field frequency band and determines one sub-band having the maximum total error which is the total of error values in that sub-band, (3) said processing unit determines a second filter which has a center frequency equal to the frequency point associated to the maximum or minimum error value in said determined one sub-band, and gain and peak factor estimated according to the error values, and (4) said processing unit obtains error values between the synthesized frequency characteristics of the determined first and second filters and the object frequency characteristics at the frequency points in the sound field frequency band, determines one sub-band having the maximum total error except for a case where the obtained error value for every frequency point is within a predetermined tolerance, and repeats the above steps (3) and (4) to sequentially determine parameters for a third, a forth . . . filters.

2. Sound field frequency characteristic compensation apparatus of claim 1, wherein said variable filter unit has a function capable of setting n filters as the maximum number, and when there remain the error between the synthesized frequency characteristics of all the n set filters and the object frequency characteristics at any frequency point over the predetermined tolerance, the center frequency of the first filter is shifted by an estimated amount with respect to the frequency point associated with the maximum remaining error value and then the steps (1)–(4) is performed by said processing unit.

3. Sound field frequency characteristic compensation apparatus of claim 1, wherein the peak factor of the peaking filter or notch filter to be set is estimated from the difference in frequency (e.g., provisional band width) between the frequency points associated with the maximum and minimum gain values or error values.

4. Sound field frequency characteristic compensation apparatus of claim 1, the peak factor of the peaking filter or notch filter to be set is estimated as a constant value when the difference in gain between the maximum and minimum gain values or error values is smaller than a predetermined gain value.

5. Sound field frequency characteristic compensation apparatus of claim 1, wherein the peak factor of the peaking filter or notch filter is estimated from the difference in gain between the gain value at the filter center frequency and the gain value at the frequency point neighboring to the filter center frequency and the difference in frequency between the filter center frequency and the frequency point neighboring to the filter center frequency.

6. Sound field frequency characteristic compensation apparatus of claim 1, wherein after obtaining the error in the synthesized frequency characteristics of the first and second filters, the processing unit determines an alternative first filter the center frequency of which is shifted from that of the first filter by an amount estimated from the obtained error, obtains the error in the synthesized frequency characteristics of the alternative first filter and second filter, and determines which one of the errors before the center frequency shifting and after the center frequency shifting is smaller, and adopts either one of the originally determined first filter and the alternative first filter which has the smaller error.

7. Sound field frequency characteristic compensation apparatus of claim 1, wherein the estimation of the peak factor is performed by fuzzy estimation rules.

8. Sound field frequency characteristic compensation apparatus of claim 1, wherein said variable filter unit comprises a plurality of Bell-type bandpass digital filters and said processing unit determines the characteristic coefficients for the digital filters.

* * * * *